(12) United States Patent
Przybylski et al.

(10) Patent No.: US 8,812,768 B2
(45) Date of Patent: Aug. 19, 2014

(54) SYSTEM HAVING ONE OR MORE MEMORY DEVICES

(75) Inventors: Steven Przybylski, Ann Arbor, MI (US); Roland Schuetz, Ottawa, CA (US); HakJune Oh, Kanata, CA (US); Hong Beom Pyeon, Kanata, CA (US)

(73) Assignee: Conversant Intellectual Property Management Inc., Ottawa (CA)

( * ) Notice: Subject to any disclaimer, the term of this patent is extended or adjusted under 35 U.S.C. 154(b) by 1690 days.

(21) Appl. No.: 12/033,577

(22) Filed: Feb. 19, 2008

(65) Prior Publication Data

US 2008/0201548 A1  Aug. 21, 2008

Related U.S. Application Data

(60) Provisional application No. 60/902,003, filed on Feb. 16, 2007, provisional application No. 60/892,705, filed on Mar. 2, 2007.

(51) Int. Cl.
*G06F 12/00* (2006.01)

(52) U.S. Cl.
USPC .............. 711/103; 711/E12.069; 711/170

(58) Field of Classification Search
USPC ...................................... 711/103
See application file for complete search history.

(56) References Cited

U.S. PATENT DOCUMENTS

| | | |
|---|---|---|
| 4,174,536 A | 11/1979 | Misunas et al. |
| 4,899,316 A | 2/1990 | Nagami |
| 5,038,299 A | 8/1991 | Maeda |
| 5,204,669 A | 4/1993 | Dorfe et al. |
| 5,243,703 A | 9/1993 | Farmwald et al. |
| 5,404,460 A | 4/1995 | Thomsen et al. |
| 5,430,859 A | 7/1995 | Norman et al. |

(Continued)

FOREIGN PATENT DOCUMENTS

| | | |
|---|---|---|
| CA | 2310080 | 5/1999 |
| JP | 06266614 | 9/1994 |

(Continued)

OTHER PUBLICATIONS

Lee, S. et al., "A 3.3V 4Gb Four-Level NAND Flash Memory with 90nm CMOS Technology", ISSCC 2004/Session 2Non-Volatile Memory/2.7, IEEE International Solid-State Circuits Conference, Feb. 15-19, 2004,Digest of Technical Papers, 10 pages, vol. 1, XP010722148, ISBN: 0-7803-8267-6.

(Continued)

*Primary Examiner* — Reginald Bragdon
*Assistant Examiner* — Hamdy S Ahmed
(74) *Attorney, Agent, or Firm* — Dennis R. Haszko

(57) ABSTRACT

A system having serially connected memory devices in a ring topology organization to realize high speed performance. The memory devices have dynamically configurable data widths such that the system can operate with up to a maximum common number of active data pads to maximize performance, or to operate with a single active data pad to minimize power consumption. Therefore the system can include a mix of memory devices having different data widths. The memory devices are dynamically configurable through the issuance of a single command propagated serially through all the memory devices from the memory controller in a broadcast operation. Robust operation of the system is ensured by implementing a data output inhibit algorithm, which prevents valid data from being provided to the memory controller when read output control signal is received out of its proper sequence.

21 Claims, 20 Drawing Sheets

(56) References Cited

U.S. PATENT DOCUMENTS

| | | | |
|---|---|---|---|
| 5,440,694 A | 8/1995 | Nakajima | |
| 5,636,342 A | 6/1997 | Jeffries et al. | |
| 5,729,683 A | 3/1998 | Le et al. | |
| 5,740,379 A | 4/1998 | Hartwig | |
| 5,761,146 A | 6/1998 | Yoo et al. | |
| 5,771,199 A | 6/1998 | Lee | |
| 5,777,488 A | 7/1998 | Dryer et al. | |
| 5,778,419 A | 7/1998 | Hansen et al. | |
| 5,802,399 A | 9/1998 | Yumoto et al. | |
| 5,806,070 A | 9/1998 | Norman et al. | |
| 5,828,899 A | 10/1998 | Richard et al. | |
| 5,859,809 A | 1/1999 | Kim | |
| 5,862,154 A | 1/1999 | Pawlowski | |
| 5,900,021 A | 5/1999 | Tiede et al. | |
| 5,911,053 A | 6/1999 | Pawlowski et al. | |
| 5,941,941 A | 8/1999 | Hasegawa | |
| 5,941,974 A | 8/1999 | Babin | |
| 5,982,309 A | 11/1999 | Xi et al. | |
| 6,002,638 A | 12/1999 | John | |
| 6,009,479 A | 12/1999 | Jeffries | |
| 6,094,375 A | 7/2000 | Lee | |
| 6,144,576 A | 11/2000 | Leddige et al. | |
| 6,148,363 A | 11/2000 | Lofgren et al. | |
| 6,212,591 B1 | 4/2001 | Kaplinsky | |
| 6,317,350 B1 | 11/2001 | Pereira et al. | |
| 6,317,352 B1 | 11/2001 | Halbert et al. | |
| 6,317,812 B1 | 11/2001 | Lofgren et al. | |
| 6,385,128 B1 * | 5/2002 | Arcoleo et al. | 365/233.19 |
| 6,453,365 B1 | 9/2002 | Habot | |
| 6,567,904 B1 | 5/2003 | Khandekar et al. | |
| 6,658,509 B1 | 12/2003 | Bonella et al. | |
| 6,658,582 B1 | 12/2003 | Han | |
| 6,680,904 B1 | 1/2004 | Kaplan et al. | |
| 6,763,426 B1 | 7/2004 | James et al. | |
| 6,766,411 B2 | 7/2004 | Goldshlag | |
| 6,768,431 B2 | 7/2004 | Chiang | |
| 6,792,003 B1 | 9/2004 | Nair et al. | |
| 6,795,850 B2 * | 9/2004 | Wu et al. | 709/213 |
| 6,807,106 B2 | 10/2004 | Gonzales et al. | |
| 6,889,304 B2 | 5/2005 | Perego et al. | |
| 6,919,736 B1 | 7/2005 | Agrawal et al. | |
| 6,928,501 B2 | 8/2005 | Andreas et al. | |
| 6,944,697 B2 | 9/2005 | Andreas | |
| 6,950,325 B1 | 9/2005 | Chen | |
| 6,961,882 B2 | 11/2005 | Manfred et al. | |
| 6,996,644 B2 | 2/2006 | Schoch et al. | |
| 7,031,221 B2 | 4/2006 | Mooney et al. | |
| 7,093,076 B2 | 8/2006 | Kyung | |
| 7,130,958 B2 | 10/2006 | Chou et al. | |
| 7,177,170 B2 | 2/2007 | Gomm | |
| 2002/0161941 A1 | 10/2002 | Chue et al. | |
| 2002/0188781 A1 | 12/2002 | Schoch et al. | |
| 2004/0001380 A1 | 1/2004 | Beca et al. | |
| 2004/0019733 A1 * | 1/2004 | Garinger et al. | 710/314 |
| 2004/0148482 A1 | 7/2004 | Grundy et al. | |
| 2004/0186956 A1 | 9/2004 | Perego et al. | |
| 2004/0230738 A1 | 11/2004 | Lim et al. | |
| 2005/0120163 A1 | 6/2005 | Chou et al. | |
| 2005/0160218 A1 | 7/2005 | See et al. | |
| 2005/0213421 A1 | 9/2005 | Polizzi et al. | |
| 2006/0050594 A1 | 3/2006 | Park | |
| 2006/0248305 A1 | 11/2006 | Fang et al. | |
| 2007/0038852 A1 | 2/2007 | Bovino et al. | |
| 2007/0076479 A1 | 4/2007 | Kim et al. | |
| 2007/0076502 A1 | 4/2007 | Pyeon et al. | |
| 2007/0109833 A1 | 5/2007 | Pyeon et al. | |
| 2007/0157000 A1 | 7/2007 | Qawami et al. | |
| 2007/0233903 A1 | 10/2007 | Pyeon | |
| 2007/0234071 A1 | 10/2007 | Pyeon | |
| 2008/0016269 A1 | 1/2008 | Chow et al. | |

FOREIGN PATENT DOCUMENTS

| | | |
|---|---|---|
| JP | 11045206 | 2/1999 |
| JP | 11161544 | 6/1999 |
| WO | 2005015406 | 2/2005 |
| WO | WO 2006/036811 A2 | 4/2006 |
| WO | WO 2006038811 A2 | 4/2006 |

OTHER PUBLICATIONS

Samsung Electronics Co. Ltd, "1G × 8 Bit / 2G × 8 Bit NAND Flash Memory", K9F8GO8UXM, Mar. 31, 2007, pp. 1-54.

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, pp. 46 and 47.

Tanzawa, T. et al., "Circuit Techniques for a 1.8-V-Only NAND Flash Memory", IEEE Journal of Solid-State Circuits, vol. 37, No. 1, Jan. 2002, pp. 84-89.

Saito S., et al., "A Programmable 8Ons 1Mb CMOS EPROM", IEEE ISSCC Digest of Technical Papers, Feb. 14, 1985, pp. 176-177, 340.

Momodomi, M. et al., "A 4-Mb NAND EEPROM with tight programmed Vt Distribution", IEEE Journal of Solid-State Circuits, vol. 26, Issue 4, Apr. 1991, pp. 492-496.

Ohtsuka, N. et al., "A 4-Mbit CMOS EPROM", IEEE Journal of Solid-State Circuits, vol. 22, Issue 5, Oct. 1987, pp. 669-675.

Kim, et al. "A 120-mm2 64-Mb NAND Flash Memory Archieving 180 ns/Byte Effective Program Speed," IEEE Journal of Solid-State Circuits, vol. 32, No. 5, May 1977, pp. 670-680.

Suh, K. et al., "A 3.3 V 32 Mb Nand Flash Memory with Incremental Step Pulse Programming Scheme", IEEE Journal of Solid-State Circuits, vol. 30, No. 11, Nov. 1995, pp. 1149-1156.

Takeuchi, K. et al., "A Multipage Cell Architecture for High-Speed Programming Multilevel NAND Flash Memories", IEEE Journal of Solid-State Circuits, vol. 33, Issue 8, Aug. 1998, pp. 1228-1238.

Tanzawa T., et al., "A dynamic analysis of the Dickson charge pump circuit;" IEEE J. Solid-State Circuits, vol. 32, No. 8, Aug. 1997, pp. 1231-1240.

Tanaka, T. et al., "A quick intelligent page-programming architecture and a shielded bitline sensing method for 3 V-only NAND flash memory", IEEE Journal of Solid-state Circuits, vol. 29, Issue 11, Nov. 1994, pp. 1366-1373.

Imamiya, K. et al., "A 125-mm2 1-Gb NAND Flash Memory with 10-MByte/s Program Speed", IEEE Journal of Solid-State Circuits, vol. 37, No. 11, Nov. 2002, pp. 1493-1501.

Lee, J. et al., "High-Performance 1-Gb NAND Flash Memory with 0.12-•m Technology", IEEE Journal of Solid-State Circuits, vol. 37, No. 11, Nov. 2002, pp. 1502-1509.

Jung, T. et al., "A 117-mm2 3.3-V Only 128-Mb Multilevel NAND Flash Memory for Mass Storage Applications," IEEEJoumal of Solid-State Circuits, vol. 31, No. 11, Nov. 1996, pp. 1575-1583.

Tomita, N. et al., "A 62-ns 16-Mb CMOS EPROMm with Voltage Stress Relaxation Technique" IEEE Journal of Solid-State Circuits vol. 26, No. 11, Nov. 1991, pp. 1593-1599.

Cho, T. et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, pp. 1700-1706.

Kirisawa, R. et al., "A NAND Structured Cell with a new Programming Technology for Highly Reliable 5V-Only Flash EEPROM", 1990 Symposium on VLSI Technology, Jun. 4, 1990, CH 2874-6, 90/0000-0129 1990 IEEE, Honolulu, US pp. 129-130.

Aritome, S. et al., "A Reliable Bi-Polarity Write/Erase Technology in Flash EEPROMS", Intl. Electron Devices Meeting, 1990, Technical Digest, Dec. 9-12, 1990, pp. 111-114.

Shirota, R., et al., "A 2.3um2 Memory Cell Structure for 16Mb NAND EEPROMs", International Electron Devices Meeting 1990, Technical Digest, (1990), pp. 103-106.

(56) References Cited

OTHER PUBLICATIONS

Hara, T. et al., "A 146-mmΛ2 8-Gb Multi-Level NAND Flash Memory With 70-nm CMOS Technology", IEEE Journal of Solid State Circuits, Jan. 2006, vol. 41, No. 1, pp. 161-169.

Lee, S. et al., "A 3.3V 4Gb Four-Level NAND Flash Memory with 90nm CMOS Technology", ISSCC 2004/Session 2Non-Volatile Memory/2.7, IEEE International Solid-State Circuits Conference, Feb. 15-19, 2004,Digest of Technical Papers, pp. 52-513, vol. 1, XP010722148, ISBN: 0-7803-8267-6.

Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Session 7, Feb. 6-9, 2006, pp. 144,145,645, ISBN: 1-4244-0079-1.

Samsung Electronics Co. Ltd, "256M x 8 Bit / 128 M x 16 Bit / 512M x 8 Bit NAND Flash Memory", K9K4G08U1M, May 6, 2005, pp. 1-41.

Samsung Electronics Co. Ltd, "1G x 8 Bit / 2G x 8 Bit NAND Flash Memory", K9F8G08UXM, May 31, 2007, pp. 1-54.

Samsung Electronics Co. Ltd, "512M x 8 Bit / 1G x 8 Bit NAND Flash Memory", K9XXG08UXA, May 7, 2006, pp. 1-43.

Samsung Electronics Co. Ltd, "1G x 8 Bit / 2G x 8 Bit / 4G x 8 Bit NAND Flash Memory", K9XXG08UXA, Jul. 18, 2006, pp. 1-50.

Choi, Young, "16-Gbit MLC NAND Flash Weighs in", EETimes.com, Jul. 30, 2007, pp. 1-3, http://www.eetimes.com/showArticle.jhtmlarticleID=201200825.

Gal, et al., "Algorithms and data structures for flash memories", ACM Computing Surveys (CSUR), vol. 37, No. 2, p. 138-163, Jun. 2005, Tel Aviv University.

Lee J. et al., "A 90-nm CMOS 1.8-V 2-Gb NAND Flash Memory for Mass Storage Applications", IEEE Journal of Solid-State Circuits, vol. 38, No. 11, Nov. 2003. pp. 1934-1942.

Samsung Electronics Co. Ltd, "2G x 8 Bit NAND Flash Memory", K9GAG08U0M, Apr. 12, 2006, pp. 1-48.

Toshiba, "16 GBIT (2G x 8 Bit) CMOS NAND E2PROM (Multi-Level-Cell)", TC58NVG4D1DTG00, Nov. 9, 2006.

Toshiba, "2GBIT (256M x 8 Bits) CMOS NAND E2PROM", TH58NVG1S3AFT05, May 19, 2003, pp. 1-32.

"HyperTransport TM I/O Link Specification", Revision 3.00a, Document No. HTC20051222-0046-0017, 2001-2006, Hypertransport Technology Consortium, Nov. 22, 2006, pp. 1-443.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCom 1992, IEEE 0-8186-2655-0/92, pp. 328-331, Feb. 24-28, 1992.

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

Gjessing, S., et al., "A RAM Link for High Speed", Special Report/Memory, IEEE Spectrum, pp. 52-53, Oct. 1992.

Diamond, S.L., "SyncLink: High-speed DRAM for the Future", Micro Standards, IEEE Micro, pp. 74-75, Dec. 1996.

ATMEL, "8-megabit 2.5-volt Only or 2.7-volt Only DataFlash®," Technical Specification, Atmel, Rev. 2225H-DFLSH (2004).

"The I2C-Bus Specification," Version 2.1, Philips Semiconductors, Jan. 2000, pp. 1-46 pages.

"16 Mbit SPI Serial Flash," Preliminary Specification, Silicon Storage Technology Inc., (2005), 28 pages.

PCT/US2008/054307, Partial Search Annex to Form PCT/ISA/206, 5 pages, Oct. 1, 2008.

* cited by examiner

| Command Packet | 1st Byte | 2nd Byte | 3rd Byte | 4th Byte | 5th Byte | 6th Byte | 7th Byte | ... | 2115th Byte | 2116th Byte |
|---|---|---|---|---|---|---|---|---|---|---|
| Page Read | DA | 0Xh | RA | RA | RA | - | - | - | - | - |
| Page Read for Copy | DA | 1Xh | RA | RA | RA | - | - | - | - | - |
| Burst Data Read | DA | 2Xh | CA | CA | - | - | - | - | - | - |
| Burst Data Load Start | DA | 4Xh | CA | CA | DATA | DATA | DATA | ... | DATA | DATA |
| Burst Data Load | DA | 5Xh | CA | CA | DATA | DATA | DATA | ... | DATA | DATA |
| Page Program | DA | 6Xh | RA | RA | RA | - | - | - | - | - |
| Block Erase Address Input | DA | 8Xh | RA | RA | RA | - | - | - | - | - |
| Page-pair Erase Address Input | DA | 9Xh | RA | RA | RA | - | - | - | - | - |
| Erase | DA | AXh | - | - | - | - | - | - | - | - |
| Operation Abort | DA | CXh | - | - | - | - | - | - | - | - |
| Read Status Register | DA | F0h | - | - | - | - | - | - | - | - |
| Read Device Information Register | DA | F4h | - | - | - | - | - | - | - | - |
| Read I/O Width Register | DA | F7h | - | - | - | - | - | - | - | - |
| Write Current Active Width Register | FFh | FFh | DATA | - | - | - | - | - | - | - |

Fig. 10

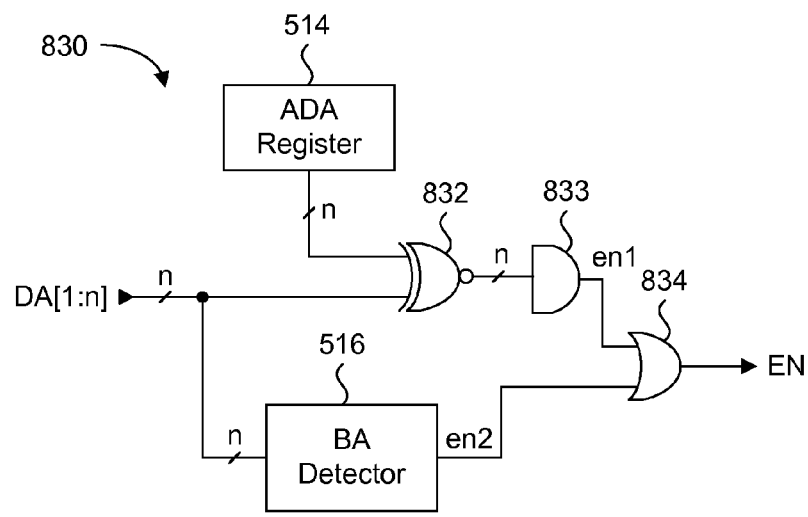
Fig. 11
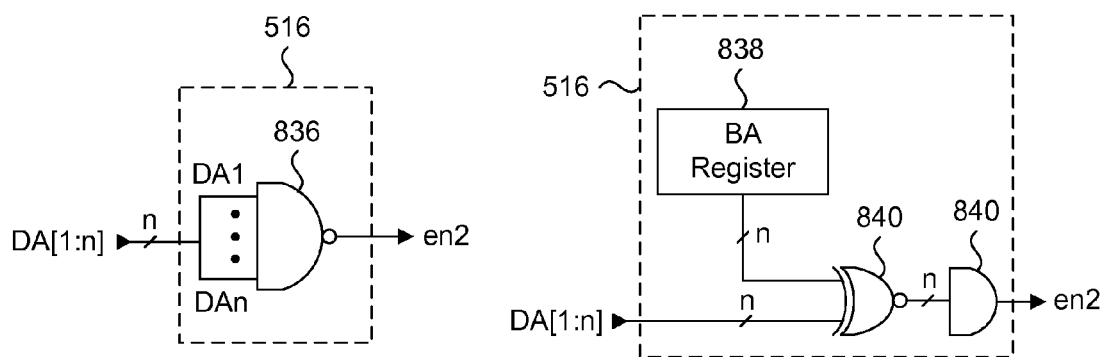
Fig. 12
Fig. 13

SYSTEM HAVING ONE OR MORE MEMORY DEVICES

CROSS REFERENCE TO RELATED APPLICATIONS

This application claims the benefit of priority of U.S. Provisional Patent Application No. 60/902,003 filed on Feb. 16, 2007, and U.S. Provisional Patent Application Ser. No. 60/892,705 filed on Mar. 2, 2007, the contents of which are incorporated herein by reference in their entirety.

BACKGROUND

Flash memory is a commonly used type of non-volatile memory in widespread use as mass storage for consumer electronics, such as digital cameras and portable digital music players for example. The density of a presently available Flash memory component, consisting of 2 stacked dies, can be up to 32 Gbits (4 GB), which is suitable for use in popular USB Flash drives, since the size of one Flash component is typically small.

The advent of 8 mega pixel digital cameras and portable digital entertainment devices with music and video capabilities has spurred demand for ultra-high capacities to store the large amounts of data, which may not be met by the single Flash memory device. Therefore, multiple Flash memory devices are combined together into a system to effectively increase the available storage capacity. For example, Flash storage densities of 20 GB may be required for such applications.

FIG. 1 is a block diagram of a prior art system 10 integrated with a host system 12. The prior art system 10 includes a memory controller 14 in communication with host system 12, and multiple non-volatile memory devices 16. The host system 12 includes a processing device such as a microcontroller, microprocessor, or a computer system. The prior art system 10 of FIG. 1 is organized to include one channel 18, with the memory devices 16 being connected in parallel to channel 18. Those skilled in the art should understand that the prior art system 10 can have more or fewer than four memory devices connected to it.

Channel 18 includes a set of common buses, which include data and control lines that are connected to all of its corresponding memory devices. Each memory device is enabled or disabled with respective chip select (enable) signals CE1#, CE2#, CE3# and CE4#, provided by memory controller 14. The "#" indicates that the signal is an active low logic level signal. At most one of the chip select signals is typically selected at one time. The memory controller 14 is responsible for issuing commands and data, via the channel 18, to a selected memory device in response to the operation of the host system 12. Read data output from the memory devices is transferred via the channel 18 back to the memory controller 14 and host system 12. Operation of the prior art system 10 can be asynchronous or synchronous. FIG. 1 illustrates an example of a synchronous system that uses a clock (CK), which is provided in parallel to each memory device 16 to synchronize data transfer on the channel 18. The prior art system 10 is generally said to include a multi-drop bus, in which the memory devices 16 are connected in parallel with respect to channel 18.

In the prior art system 10, non-volatile memory devices 16 may be (but not necessarily) substantially identical to each other, and are typically NAND flash memory devices. Those skilled in the art should understand that flash memory may be organized into banks, and that each bank may be organized into blocks to facilitate block erasure. Some commercially available NAND flash memory devices have two banks of memory.

There are specific issues that can adversely impact performance of the system. The structure of the prior art system 10 imposes physical performance limitations. There is a large number of parallel signals extending across the system, and the signal integrity of the signals they carry may be degraded by crosstalk, signal skew, and simultaneous switching noise (SSN). Input/output power consumption in such a system becomes an issue as each signal track between the flash controller and flash memory devices is frequently charged and discharged for signaling. With increasing system clock frequencies, the power consumption will increase.

There is also a practical limit to the number of memory devices which can be connected in parallel to the channel since the drive capability of a single memory device is small relative to the loading of the long signal tracks. Furthermore, as the number of memory devices increase, more chip enable signals (CE#) are required, and CK may need to be routed to the additional memory devices, all of which are longer as they are routed to the memory devices. Clock performance issues due to extensive clock distribution are well known in the art, become an issue in large Prior Art systems with many memory devices 16. Therefore, for a Prior Art memory system to include a large number of memory devices, either the memory devices are spread across multiple channels or the frequency operation of the memory system would be limited; either option involves compromises. A controller having multiple channels and additional chip enable signals increases the cost of the system. Otherwise, the system is limited to a small number of memory devices.

In the multi-drop prior art system 10 of FIG. 1, the data width of each memory device 16 must be the same. For example, if the data channel width is 32 bits then each memory device 16 must be a x32 device. If an alternate multi-drop system has an 8 bit data channel width, then the x32 memory devices cannot be used. Instead, different x8 memory devices need to be used instead. Accordingly, a memory device manufacturer will produce versions of the same memory device with different data widths in order to accommodate the possible system structures.

As consumer demand for smaller form factor products increases, manufacturers need to find ways to minimize the area or space occupied by semiconductor chips, such as the prior art system 10 of FIG. 1. Although each memory device chip can be small, the package encapsulating the chip may have a size largely determined by the number of package pins for coupling signals between the chip input/output pads and the printed circuit board (PCB) traces. Unfortunately, the prior art system 10 of FIG. 1 is not suited for applications requiring a minimized PCB area. Each memory device and the memory controller will occupy a larger PCB area due to x8, x16 or even x32 data channel widths because the package size increases as the data width increases. If the data width is reduced to minimize the package size, then performance is adversely impacted since the aggregate memory system peak bandwidth is reduced.

It is, therefore, desirable to provide a high performance system which consumes a minimal amount of board area.

BRIEF DESCRIPTION OF THE DRAWINGS

Embodiments of the present invention will now be described, by way of example only, with reference to the attached Figures, wherein:

FIG. 10 shows a table listing example modular command packets for operating the systems of FIGS. 3A and 3B;

FIG. 11 is a circuit schematic embodiment of device address logic in a memory device of the systems of FIGS. 3A and 3B;

FIG. 12 is a circuit schematic embodiment of the broadcast address detector shown in FIG. 11;

FIG. 13 is an alternate circuit schematic embodiment of the broadcast address detector shown in FIG. 11;

DETAILED DESCRIPTION

Figure 1:
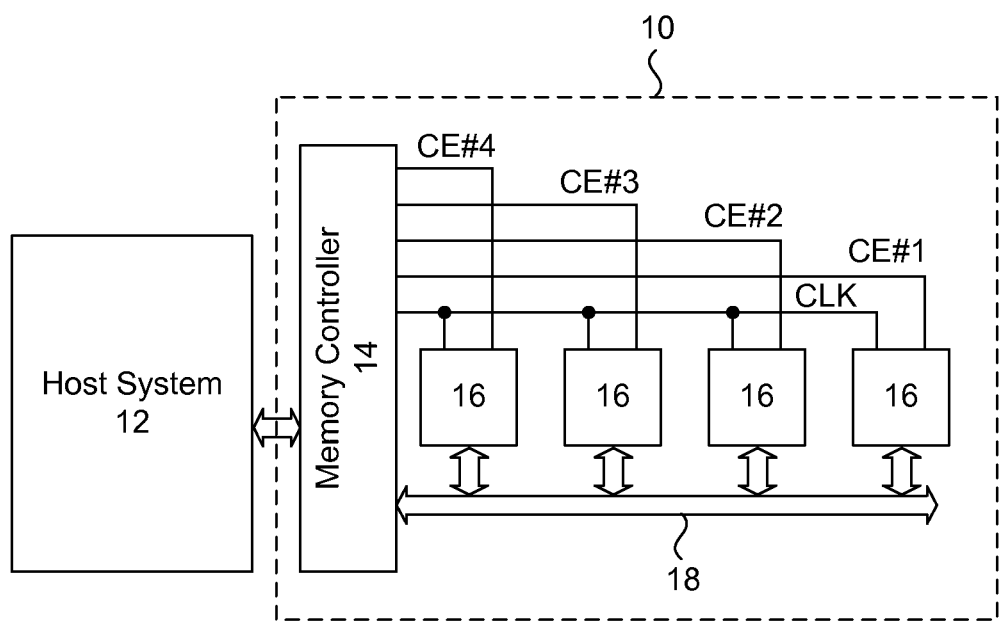
FIG. 1 is a block diagram of a prior art system comprising Flash devices.

In a first aspect, there is provided a system having a memory controller and a memory device. The memory controller includes a first number of output ports, the memory controller providing a command to access maximum data width configuration data from one output port of the first number of output ports. The memory device includes an input/output register for storing the maximum data width configuration data, a second number of data input pads and the second number of data output pads. The memory device receives the command at one data input pad of the second number of data input pads, and provides the maximum data width configuration data from one data output pad of the second number of data output pads. According to embodiments of the present aspect, the maximum data width configuration data is hardwired in the input/output register, and the memory controller includes the first number of input ports for receiving the maximum data width configuration data from one input port of the first number of input ports. In another embodiment, all of the second number of data input pads are disabled except for the one data input pad, and all of the second number of data output pads are disabled except for the one data output pad.

In an aspect of the embodiment, the memory device includes a current active width register for storing a configuration code received from the memory controller. The configuration code enables a third number of the data input pads and the third number of the data output pads, where the third number is less than or equal to the second number. Furthermore, the memory device includes a memory die encapsulated in a package, where the package has a fourth number of data input pins and data output pins. In this embodiment, a smallest common number of data input pins are electrically connected to the smallest common number of data input pads, where the smallest common number is the smaller of the second number and the fourth number. The third number can be between one and the smallest common number. In a further aspect of the embodiment, there is provided a fifth number of conductive tracks electrically connecting the first number of output ports to the fourth number of input pins, and the third number is the smaller of the smallest common number and the fifth number of conductive tracks.

In a second aspect, there is provided a memory device having a current active width register, a first data input/output circuit block and a second data input/output circuit block. The current active width register stores a configuration code. The first data input/output circuit block receives the configuration code from a data input pad. The data input/output circuit block passes the configuration code to the current active width register. The second data input/output circuit block is selectively enabled in response to the configuration code stored in the current active width register. In an embodiment of the present aspect, there is further provided an input/output register for storing maximum data width configuration data, where the maximum data width configuration data is provided by the first data input/output circuit block through a data output pad. In a further aspect of the current embodiment, the current active width register, the first data input/output circuit block, the second data input/output circuit block, the input/output register, the data input pad and the data output pad are formed on a memory die encapsulated in a package. The package can include exactly one data input pin coupled to the first data input/output circuit block. Alternately, the package can include a first data input pin coupled to the first data input/output circuit block, and a second data input pin coupled to the second data input/output circuit block. Furthermore, the package can include at least one more additional data input pin.

In a third aspect, there is provided a method for setting a data width for a system having at least one memory device connected in a ring topology configuration with a memory controller. The method includes accessing configuration data stored in the at least one memory device, the configuration data corresponding to a maximum data width of the at least one memory device; determining a smallest data width of all the configuration data; and setting a selected data width between one and the smallest data width in the at least one memory device. According to embodiments of the present aspect, accessing can include assigning an identification number for the at least one memory device, and issuing a read command serially on a single data line corresponding to a data width of one. In an aspect of the embodiment, the selected data width is determined by an operating profile of the system, where the operating profile corresponds to maximizing performance of the system by setting the selected data width to be the smallest data width. Alternately, the operating profile corresponds to minimizing power consumption of the system by setting the selected data width to be one.

In a further embodiment of the present aspect, setting includes loading a current active width register of the at least one memory device with a configuration code corresponding to the selected data width. Setting can further include issuing a command addressed to the at least one memory device for writing the configuration code to the current active width register. In another embodiment, the system includes a plurality of memory devices connected in series, and setting includes issuing a command with a broadcast address recognizable by the plurality of memory devices for writing the configuration code to the current active width register of each of the plurality of memory devices.

In a fourth aspect, there is provided a method for broadcasting a command to memory devices serially connected in a ring topology configuration with a memory controller. The method includes issuing one command packet having an op code corresponding to the command, and a broadcast address; receiving the command packet serially in the memory devices, each of the memory devices being configured to recognize an assigned device address and the broadcast address; executing the op code in each of the memory devices in response to the broadcast address; and passing the command packet from a last memory device of the memory devices to the memory controller to end broadcasting. In an embodiment of the present aspect, the command packet includes an address field n-bits in length for providing $2^n$ total device addresses, where $(2^n)-1$ of the total device addresses are assigned device addresses and one of the $(2^n)-1$ total device addresses is the broadcast address. The broadcast address can be a highest logical address of the $2^n$ total device addresses, where each of the memory devices logically decodes the broadcast address for enabling execution of the op code. Alternately, an assigned broadcast address is stored in each of the memory devices such that the broadcast address is matched to the assigned broadcast address for enabling execution of the op code.

In a fifth aspect, there is provided a method for inhibiting data output in a memory device. The method includes receiving a data output control signal for outputting read data; and inhibiting data output circuits when a previously received command corresponds to a non-read related command, and enabling the data output circuits when the previously received command corresponds to a read-related command. In an embodiment of the present aspect, inhibiting includes outputting a continuous sequence of data corresponding to one of logic "1" data and logic "0" data. Enabling includes operating a serial data register to provide the read data serially in response to a clock while the data output control signal is at an active logic level. Inhibiting includes de-coupling the clock from the serial data register while the data output control signal is at the active logic level. In the present embodiment, the previously received command is latched in response to a command latch signal at an active logic level, and the clock is logically de-coupled from the serial data register when a control signal corresponding to a write operation is latched in response to the active logic level of the command latch signal.

In a sixth aspect, there is provided a read data output circuit including a serial data register, first logic circuitry and second logic circuitry. The serial data register serially outputs read data in response to a clock. The first logic circuitry couples the clock to the serial data register in response to an active logic level of a data output control signal. The second logic circuitry disables the clock during a non-read related operation.

Figure 2A:
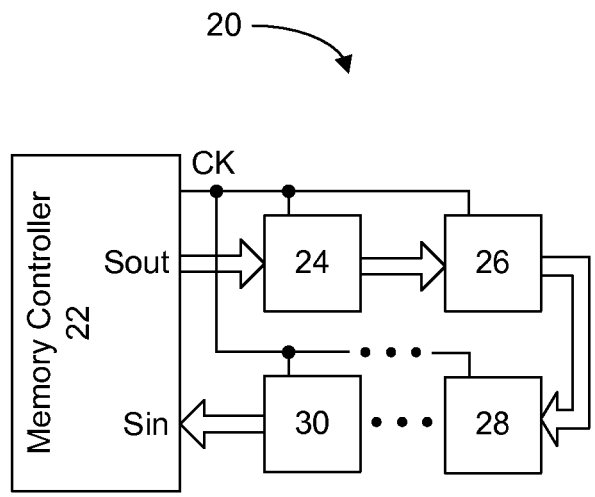
FIG. 2A is a block diagram of a system receiving a parallel clock signal.
Figure 2B:
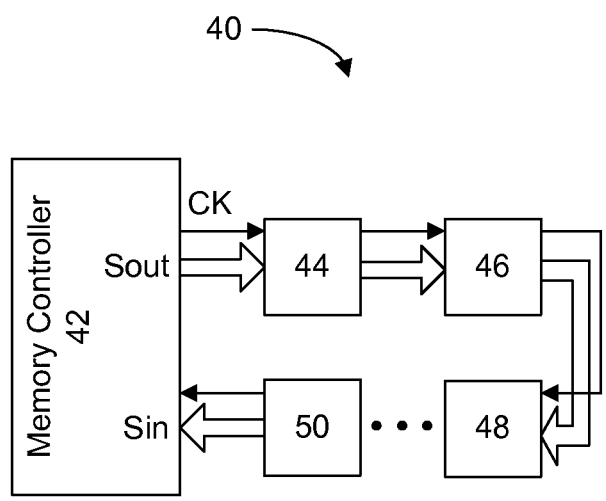
FIG. 2B is a block diagram of a system receiving a source synchronous clock signal in series.

A system that resolves many performance issues of the prior art system 10 of FIG. 1 is a system in which the memory devices are serially connected with each other and the memory controller in a ring topology configuration. FIGS. 2A and 2B are block diagrams illustrating the conceptual nature of a system according to the presently described embodiments. FIG. 2A is a block diagram of a system receiving a parallel clock signal while FIG. 2B is a block diagram of the same system of FIG. 2A receiving a source synchronous clock signal. The clock signal can be either a single ended clock signal or a differential clock pair.

In FIG. 2A, the system 20 includes a memory controller 22 having at least one output port Sout and an input port Sin, and memory devices 24, 26, 28 and 30 that are connected in series. While not shown in FIG. 2A, each memory device has an Sin input port and an Sout output port. Input and output ports consist of one or more physical pins or connections interfacing the memory device to the system it is a part of. In one embodiment, the memory devices can be flash memory devices. Alternately, the memory devices can be DRAM, SRAM or any other type of memory device provided it has an input/output interface compatible with a specific command structure, for executing commands or for passing through commands and data to the next memory device. The current example of FIG. 2A includes four memory devices, but alternate embodiments can include a single memory device, or any suitable number of memory devices. Accordingly, if memory device 24 is the first device of the system 20 as it is connected to Sout, then memory device 30 is the Nth or last device as it is connected to Sin, where N is an integer number greater than zero. Memory devices 26 to 28 are then intervening serially connected memory devices between the first and last memory devices. Each memory device can assume a distinct identification (ID) number, or device address (DA) upon power up initialization of the system, so that they are individually addressable. Commonly owned U.S. patent application Ser. No. 11/622,828 titled "APPARATUS AND METHOD FOR PRODUCING IDS FOR INTERCONNECTED DEVICES OF MIXED TYPE", U.S. patent application Ser. No. 11/750,649 titled "APPARATUS AND METHOD FOR ESTABLISHING DEVICE IDENTIFIERS FOR SERIALLY INTERCONNECTED DEVICES", U.S. patent application Ser. No. 11/692,452 titled "APPARATUS AND METHOD FOR PRODUCING DEVICE IDENTIFIERS FOR SERIALLY INTERCONNECTED DEVICES OF MIXED TYPE", U.S. patent application Ser. No. 11/692,446 titled "APPARATUS AND METHOD FOR PRODUCING IDENTIFIERS REGARDLESS OF MIXED DEVICE TYPE IN A SERIAL INTERCONNECTION", U.S. patent application Ser. No. 11/692,326 titled "APPARATUS AND METHOD FOR IDENTIFYING DEVICE TYPE OF SERIALLY INTERCONNECTED DEVICES", U.S. patent application Ser. No. 11/771,023 titled "ADDRESS ASSIGNMENT AND TYPE RECOGNITION OF SERIALLY INTERCONNECTED MEMORY DEVICES OF MIXED TYPE" and U.S. patent application Ser. No. 11/771,241 titled "SYSTEM AND METHOD OF OPERATING MEMORY DEVICES OF MIXED TYPE" describe methods for generating and assigning device addresses for serially connected memory devices of a system, the contents of which are incorporated by reference in their entirety.

Memory devices 24 to 30 are considered serially connected because the data input of one memory device is connected to the data output of a previous memory device, thereby forming a series-connection system organization, with the exception of the first and last memory devices in the chain. The channel of memory controller 22 includes data, address, and control information provided by separate pins, or the same pins, connected to conductive lines. The embodiment of FIG. 2A includes one channel, where the one channel includes Sout and corresponding Sin ports. However, memory controller 22 can include any suitable number of channels for accommodating separate memory device chains. In the example of FIG. 2A, the memory controller 22 provides a clock signal CK, which is connected in parallel to all the memory devices.

In general operation, the memory controller 22 issues a command through its Sout port, which includes an operation code (op code), a device address, optional address information for reading or programming, and data for programming. The command may be issued as a serial bitstream command packet, where the packet can be logically subdivided into segments of a predetermined size. Each segment can be one byte in size for example. A bitstream is a sequence or series of bits provided over time. The command is received by the first memory device 24, which compares the device address to its assigned address. If the addresses match, then memory device 24 executes the command. The command is passed through its own output port Sout to the next memory device 26, where the same procedure is repeated. Eventually, the memory device having the matching device address, referred to as a selected memory device, will perform the operation specified by the command. If the command is a read data command, the selected memory device will output the read data through its output port Sout (not shown), which is serially passed through intervening memory devices until it reaches the Sin port of the memory controller 22. Since the commands and data are provided in a serial bitstream, the clock is used by each memory device for clocking in/out the serial bits and for synchronizing internal memory device operations. This clock is used by all the memory devices in the system 20.

Because the clock frequency used in the system according FIG. 2A is relatively low, unterminated full swing CMOS signaling levels can be used to provide robust data communication. This is also referred to as LVTTL signaling, as would be well known to those skilled in the art.

A further performance improvement over the system 20 of FIG. 2A can be obtained by the system of FIG. 2B. System 40 of FIG. 2B is similar to the system 20 of FIG. 2A, except that the clock signal CK is provided serially to each memory device from an alternate memory controller 42 that provides the source synchronous clock signal CK. Each memory device 44, 46, 48 and 50 may receive the source synchronous clock on its clock input port and forward it via its clock output port to the next device in the system. In some examples of the system 40, the clock signal CK is passed from one memory device to another via short signal lines. Therefore none of the clock performance issues related to the parallel clock distribution scheme are present, and CK can operate at high frequencies. Accordingly, the system 40 can operate with greater speed than the system 20 of FIG. 2A. For example, high speed transceiver logic (HSTL) signaling can be used to provide high performance data communication. In the HSTL signaling format, each memory device may receive a reference voltage that is used for determining a logic state of the incoming data signals. Another similar signaling format is the SSTL signaling format. Accordingly, the data and clock input circuits in the memory devices of the systems 20 and 40 are structured differently from each other. Both the HSTL and SSTL signaling formats should be well known to those skilled in the art.

Figure 3A:
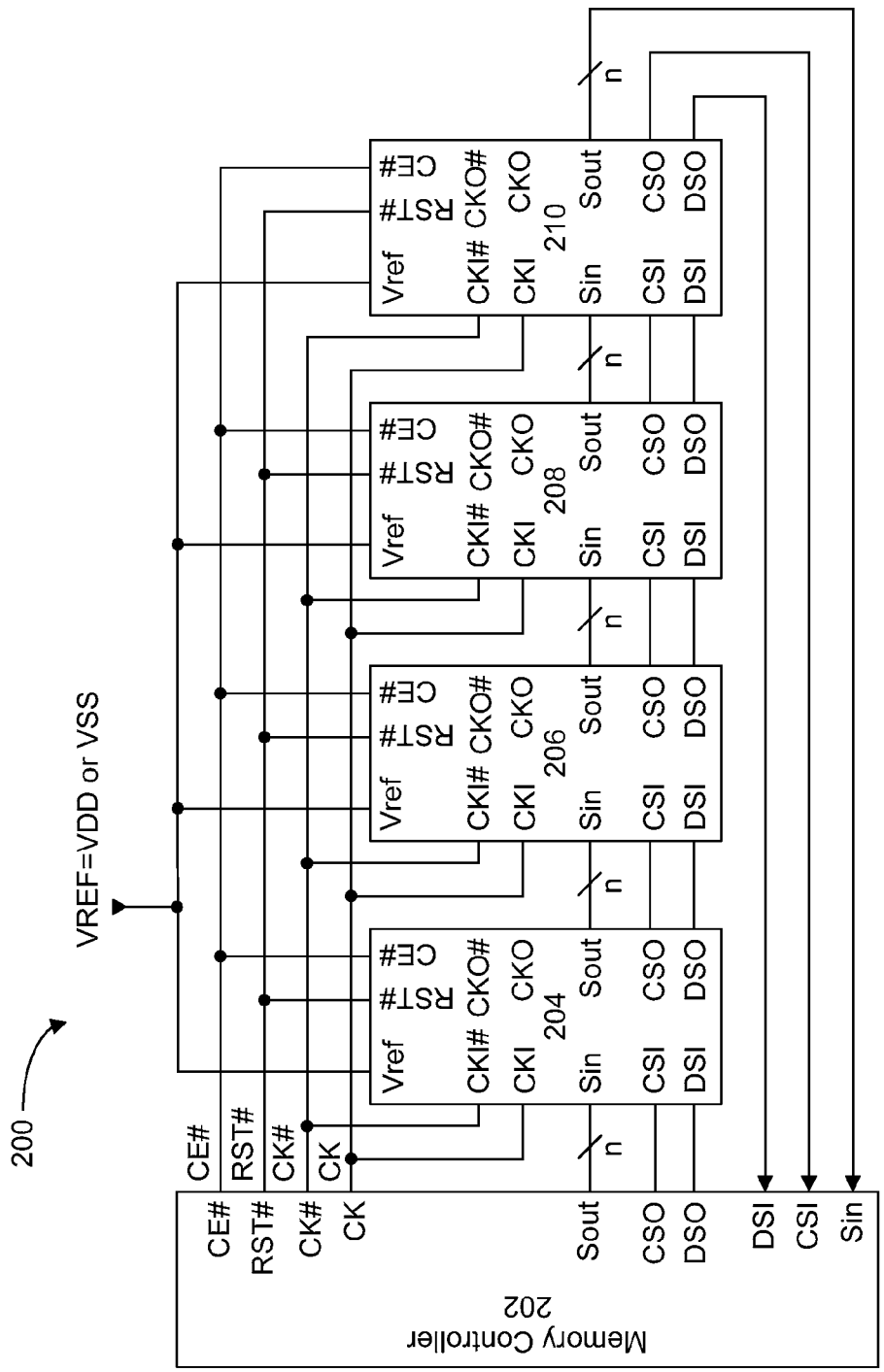
FIG. 3A is a detailed block diagram of the system of FIG. 2B.
Figure 3B:
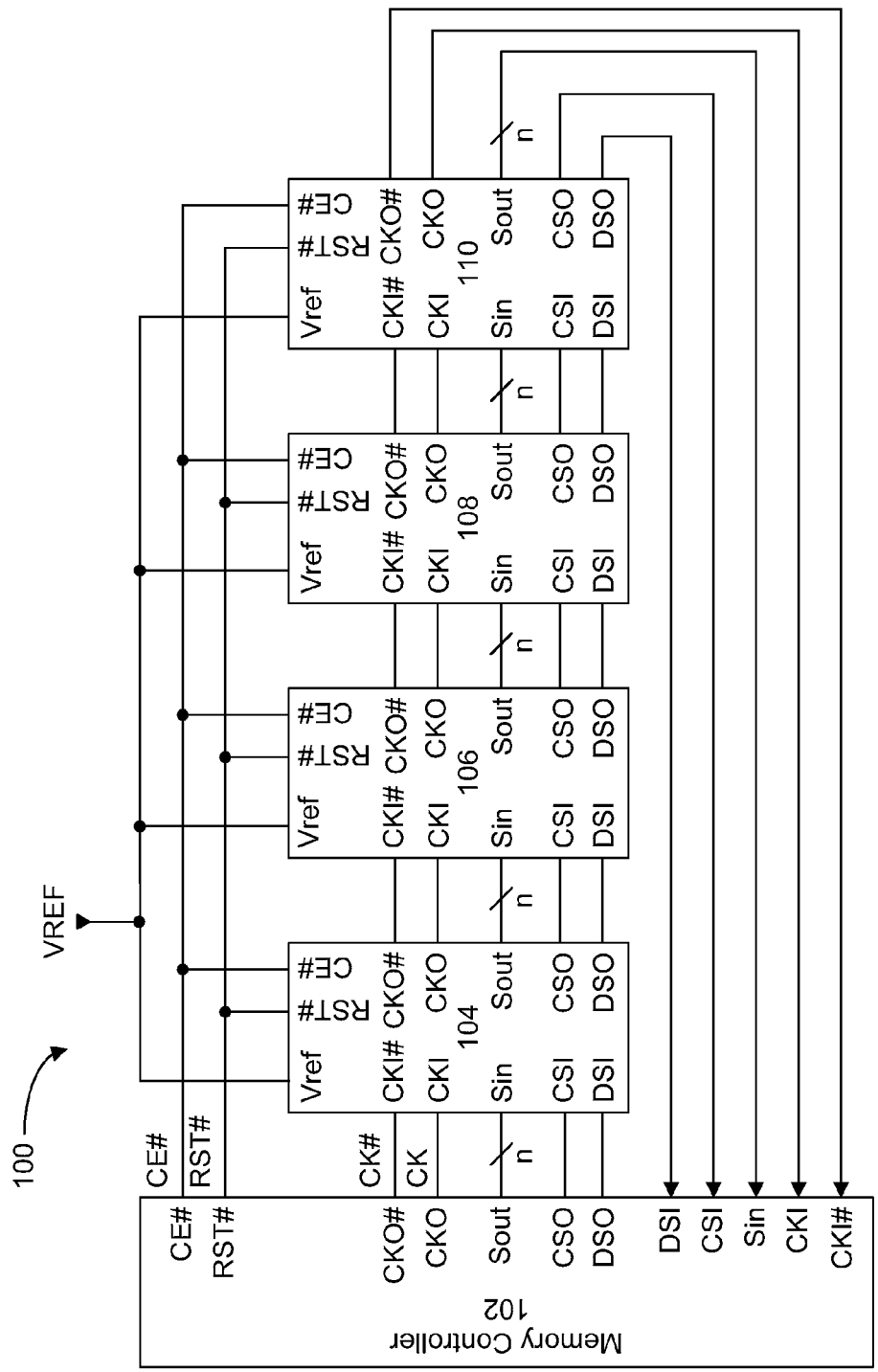
FIG. 3B is a detailed block diagram of the system of FIG. 2A.

FIGS. 3A and 3B are block diagrams of systems, where the memory devices of the system of FIG. 3A receive the clock in parallel and the memory devices of the system of FIG. 3B receive the clock in series. In the presently described embodiments, both systems are systems having memory devices connected in series with each other in a ring topology with the memory controller. Each memory device is designed to receive commands and data in one or more serial bitstreams received from the memory controller or a prior memory device. Generally, commands and read data flow serially through each memory device in the system. Accordingly, such memory devices can be referred to as serial memory devices since their input and output interface circuits receive and provide data serially. In the system embodiments of FIGS. 3A and 3B, four memory devices are shown connected in series in a ring topology with the memory controller, however any suitable number of memory devices can be included in either system.

In FIG. 3A, the system 100 includes a memory controller 102 and four memory devices 104, 106, 108 and 110. The memory controller 102 provides control signals in parallel to the memory devices. These include the chip enable signal CE# and the reset signal RST#. In one example use of CE#, the devices are enabled when CE# is at the low logic level. In previously considered devices, once a Flash memory device started a program or erase operation, CE# could be de-asserted, or driven to a high logic level. However in the present embodiment, de-asserting CE# has the effect of disabling communication from Sin to Sout of the disabled serial memory device. Since the serial memory devices are connected in a ring, disabling any of the devices breaks communication around the ring and the memory controller becomes unable to communicate with all of the memory devices in the memory system. As a result, CE# is a common signal to all serial memory devices, and is used to put the entire memory into a low power state. In one example use of RST#, the memory device is set to a reset mode when RST# is at the low logic level. In the reset mode, the power is allowed to stabilize and the device prepares itself for operation by initializing all finite state machines and resetting any configuration and status registers to their default states. The memory controller 102 includes clock output ports CKO# and CKO for providing complementary clock signals CK and CK#, and clock input ports CKI# and CKI for receiving the complementary clock signals from the last memory device of the system. Each memory device may include a clock synthesizer, such as a DLL or a PLL for generating phases of the received clocks. Certain phases are used to center the clock edges within the input data valid window internally to ensure reliable operation. Each memory device has clock output ports CKO# and CKO for passing the complementary clock signals to the clock input ports of the next memory device, and clock input ports CKI and CKI# for receiving the complementary clock signals from either the memory controller 102 or a previous memory device. The last memory device 110 provides the clock signals back to the memory controller 102.

The channel of memory controller 102 includes data output port Sout, data input port Sin, a command strobe input CSI, a command strobe output CSO (echo of CSI), data strobe input DSI, and a data strobe output DSO (echo of DSI). Output port Sout and input port Sin can be one bit in width, or n bits in width where n is a positive integer, depending on the characteristics of the memory controller. For example, if n is 1 then one byte of data is received after eight data latching edges of the clock. A data latching clock edge can be a rising clock edge for example in single data rate (SDR) operation, or both rising and falling edges of the clock for example in double data rate (DDR) operation. If n is 2 then one byte of data is received after four latching edges of the clock. If n is 4 then one byte of data is received after two latching edges of the clock. The memory device can be statically configured or dynamically configured for any width of Sout and Sin. Hence, in a configuration where n is greater than 1, the memory controller provides data in parallel bitstreams. CSI is used for controlling or enabling the latching command data appearing on the input port Sin, and has a pulse duration for delimiting the time when a command is present on the data input port Sin. More specifically, the command data will have a duration measured by a number of clock cycles, and the pulse duration of the CSI signal will have a corresponding duration. DSI is used for enabling the output port Sout buffer of a selected memory device to output read data, and has a pulse duration for delimiting read data provided from its data output port Sout so that the memory controller knows when to latch data on its return from the last memory device.

Since the presently described embodiment of FIG. 3A is intended for high speed operation, a high speed signaling format, such as the HSTL signaling format for example, is used. Accordingly, a reference voltage VREF is provided to each memory device which is used by each memory device to determine the logic level of the signals received at the Sin, CSI and DSI input ports. The reference voltage VREF may be generated by another circuit on the printed circuit board, for example, and is set to a predetermined voltage level based on the voltage swing mid-point of the HSTL signal.

In use of the embodiment of FIG. 3A, each memory device is positioned on a printed circuit board such that the distance and signal track length between the Sout output port pins on one device and the Sin input port pins of the next device in the ring is minimized. Alternately, the four memory devices can be collected in a system in package module (SIP) which further minimizes signal track lengths. Memory controller 102 and memory devices 104 to 110 are serially connected to form a ring topology, meaning that the last memory device 110 provides its outputs back to the memory controller 102. As such, those skilled in the art will understand that the distance between memory device 110 and memory controller 102 is easily minimized.

In FIG. 3B, system 200 includes a memory controller 202 and the memory devices 204, 206, 208 and 210. The memory controller 202 may be designed to provide similar functionality to that of the memory controller 102 illustrated in FIG. 3A, except that the clock signals are provided in parallel, therefore the clock output ports CKO# and CKO of each memory device are not present or unconnected. Furthermore, the signaling format for the data and the strobe signals is different for the system of FIG. 3A as compared with the system of FIG. 3B. For example, the signaling format for the system of FIG. 3B can be the full swing un-terminated LVTTL signaling format. The LVTTL signaling used in conjunction with/at lower clock frequencies does not use a reference voltage VREF. Memory devices for use only in systems of FIG. 3B do not need a VREF input. If a VREF input is present, it is because they are also capable of communicating according to a high-speed signaling convention that does require VREF. In such a case VREF is set to a voltage level other than the signaling midpoint out of convenience or to indicate that LVTTL signaling is being used. For example, for such a device, VREF might be set to either VDD or VSS to indicate LVTTL signaling and a network organization according the FIG. 3B, as opposed to HSTL signaling and a network configuration according to FIG. 3A.

According to an example embodiment, memory devices 104, 106, 108 and 110 of FIG. 3A and memory devices 204, 206, 208 and 210 of FIG. 3B can be any type of memory device having an input/output interface designed for serial interconnection with other memory devices. According to the presently described embodiments, the memory devices of FIGS. 3A and 3B may be the same, and are thus operable in both systems as they will have input and output buffer circuits which can operate with LVTTL input signals or HSTL input signals. Those skilled in the art will understand that the memory devices can include input and output buffer circuits for operating with other types of signal formats equivalent to LVTTL or HSTL signals. While these memory devices can be flash memory devices, they might also be DRAM, SRAM or any other suitable type of volatile or non-volatile memory device.

Figure 4:
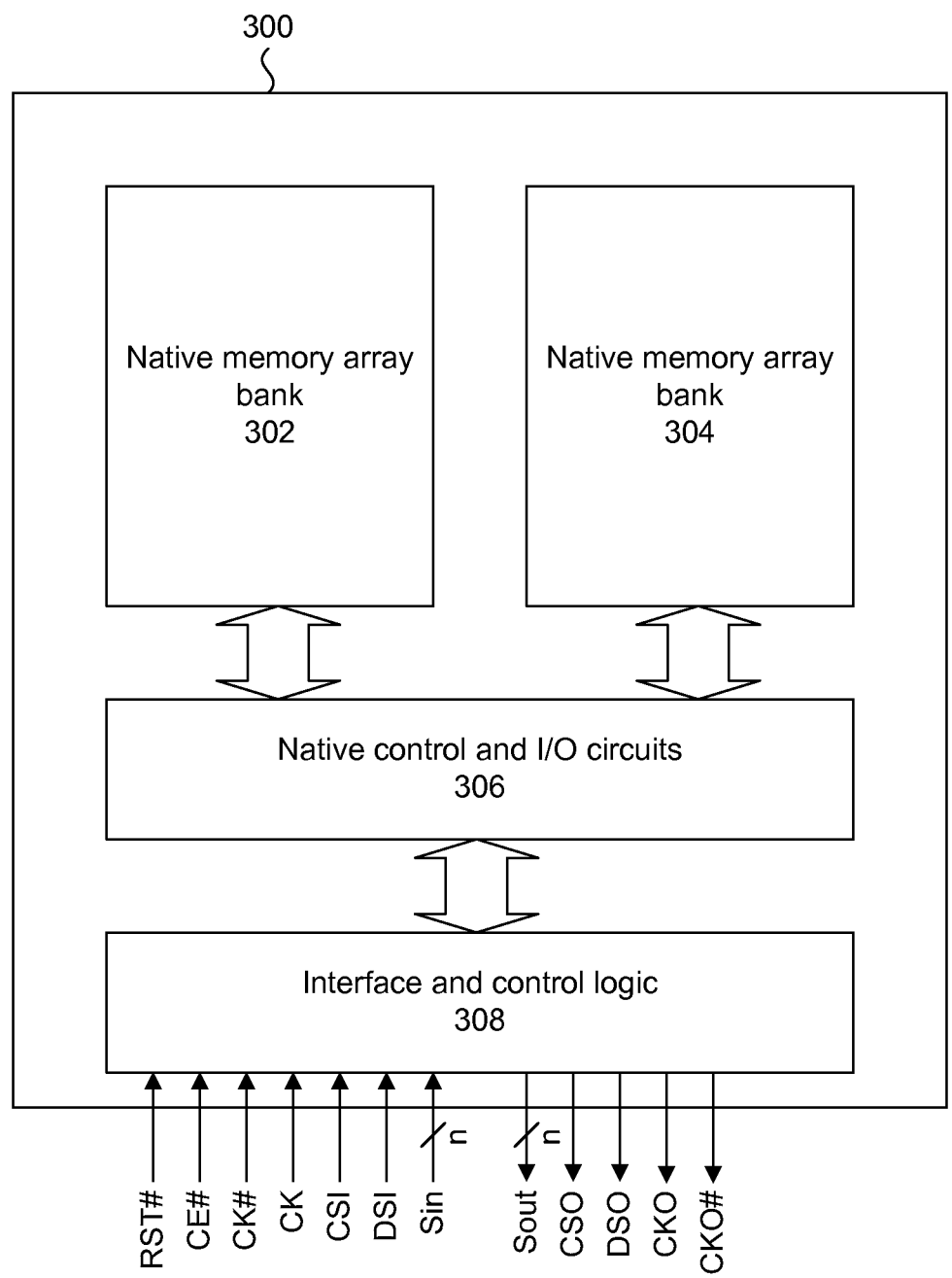
FIG. 4 is a block diagram of a generic memory device having a core and an input/output interface for use in the systems of FIGS. 3A and 3B.

FIG. 4 is a block diagram illustrating the conceptual organization of a generic memory device having a core and an input/output interface suitable for use in the systems of FIGS. 3A and 3B. Memory device 300 includes a memory core, which includes memory array banks 302 and 304, and control and I/O circuits 306 for accessing the memory array banks 302 and 304. Those skilled in the art will understand that the memory array can be organized as a single memory bank or with two or more memory banks. The memory core can be DRAM, SRAM, NAND flash, or NOR flash memory based for example. Of course, any suitable emerging memory and its corresponding control circuits can be used. Accordingly, depending on the type of memory core, circuit block 306 can include error correction logic, voltage generators, refresh logic and any other circuit blocks that are required for executing the operations native to the memory type.

Typically, memory devices use command decoders for initializing the relevant circuits in response to a received command by asserting internal control signals. They will also include well known I/O circuitry for receiving and latching data, commands and addresses. Unlike the corresponding circuits in conventional Flash memories, the memory devices of the present invention includes a serial interface and control logic block 308. This block receives RST#, CE#, CK#, CK, CSI, DSI and Sin inputs, and provides Sout, CSO, DSO, CKO and CKO# outputs.

The interface and control logic block 308 is responsible for various functions, as discussed in commonly owned U.S. Patent Publication No. 20070076479 A1. Example functions of interface and control logic block 308 include setting a device identifier number, passing data through to the next serially connected memory device, and decoding a received command for executing native operations. This circuit receives commands serially, including commands specific to controlling or configuring the serial operation of the memory device, in addition to native commands specific for controlling core memory circuits, including those for storing and retrieving information from the memory array. For example, the memory devices of the presently described embodiments respond both to commands relating to management of the serial link (for example commands providing read access to a status register) as well native commands relating to the storage and retrieval of information. The command set can be expanded to include features usable by the memory controller when the memory devices are serially connected. For example, status register information can be requested to assess the status of the memory device.

The setting of a device identifier (ID) number can be done in several ways. For example, the device ID number can be preset or hardwired in each memory device, or it can be assigned by the memory controller. One technique is ID number self-assignment, which is disclosed in commonly owned U.S. patent application Ser. No. 11/613,563 filed Dec. 20, 2006, the disclosure of which is incorporated herein by reference in its entirety. In ID number self-assignment, a write ID operation is initiated within a first memory device to cause the device to establish an ID. The first memory device receives a first value by acquiring the state of its Sin input. The first device then establishes a device ID from the first value, which may include placing the first value in storage (e.g., a register) associated with the device. The first device generates a second value from the acquired state of the inputs. This second value can be the first value incremented by one for example. The first memory device outputs the second value from its Sout output to a second memory device. The second memory device receives the second value and repeats the aforementioned process to establish its unique ID.

In an alternate device ID number assignment technique, described in commonly owned U.S. patent application Ser. No. 11/843,024, filed on Aug. 22, 2007, the contents of which are incorporated by reference, the memory devices of the system are first initialized into a reset state, followed by the memory controller iteratively issuing specific device ID numbers to each memory device. The first memory device will receive and accept the assigned ID number, and then exit from the reset state. In the reset state, the memory devices will not pass device ID numbers to the subsequent memory device. The memory controller monitors its data input for an echo of the assigned ID number. If the echo is not received after a predetermined period of time, then the next ID number is issued. Intervening memory devices not in the reset state will pass the ID number to the next memory device.

The systems of FIGS. 3A and 3B can include a mix of memory device types, each providing different advantages for the host system. Such systems having memory devices of mixed types is disclosed in commonly owned U.S. Provisional Patent Application No. 60/868,773 filed Dec. 6, 2006, the disclosure of which is incorporated herein by reference in its entirety. Further details are such systems are disclosed in commonly owned U.S. patent application Ser. No. 11/771,023 titled "ADDRESS ASSIGNMENT AND TYPE RECOGNITION OF SERIALLY INTERCONNECTED MEMORY DEVICES OF MIXED TYPE", and in commonly owned U.S. patent application Ser. No. 11/771,241 titled "SYSTEM AND METHOD OF OPERATING MEMORY DEVICES OF MIXED TYPE", the contents of which are incorporated by reference. For example, the high speed of DRAM memory can be use as a cache while non-volatile flash memory can be used for low power mass data storage. Regardless of the type of memory device being used, each memory device is individually addressable to act upon a command because the interface and control logic block 308 receives commands according to a predetermined protocol. Furthermore, non-memory devices can be included in the systems of FIGS. 3A and 3B, provided they can act on serially received commands, and pass the commands and read data to subsequent devices in the system.

An advantage of the memory devices shown in FIGS. 3A, 3B and 4, is that a memory device manufactured to be a x8 physical device width, meaning that it will have Sin[0:7] serial input ports and corresponding Sout[0:7] serial output ports, does not have to use all its input and output ports. This means that a single x8 serial memory device can be selectively and dynamically configured to be used in a wide variety of systems with different effect channel widths. A benefit of this capability is that a system designer can choose from a wider selection of available parts when architecting a new system. The other side of this benefit is that memory vendors can sell memory devices that are intrinsically wide into systems that have narrow links.

Figure 5A:
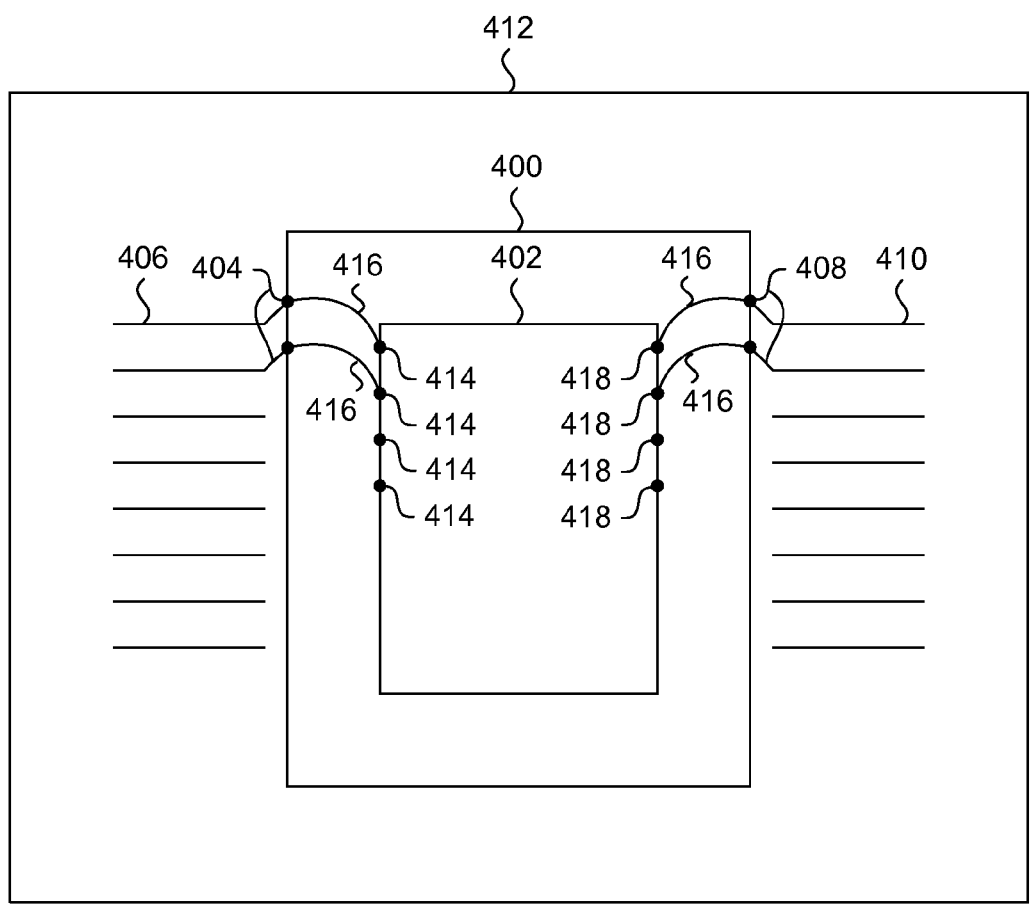
FIG. 5A is an example illustration of a memory device interconnected to a PCB through a package.

FIG. 5A is a drawing showing a top down view of a package 400 encapsulating a memory die 402 in one possible way. Package 400 with a memory die 402 corresponds to a memory device shown in FIGS. 3A and 3B. The package 400 has data input pins 404, and data output pins 408, which are structures for electrically connecting the die 402 to a printed circuit board (PCB) 412. In the PCB 412 includes a link consisting of a set of conductive tracks or traces 406 and 410, which are connected to the pins 404 and 408 of the package 400. In FIG. 5A, each set of traces 406 and 410 includes eight individual traces. The memory die 402 has data input pads 414 and corresponding data output pads 418. The data input pads 414 are electrically connected to corresponding data input pins 404, and the data output pads 418 are electrically connected to corresponding data output pins 408. These electrical connections are presently shown in FIG. 5A as bond wires 416, but solder bumps can be used instead. In the present example, only the data input and output pads and pins are shown, while the control signal inputs and outputs, and voltage supply inputs are not shown in order to simplify the diagram.

Figure 5B:
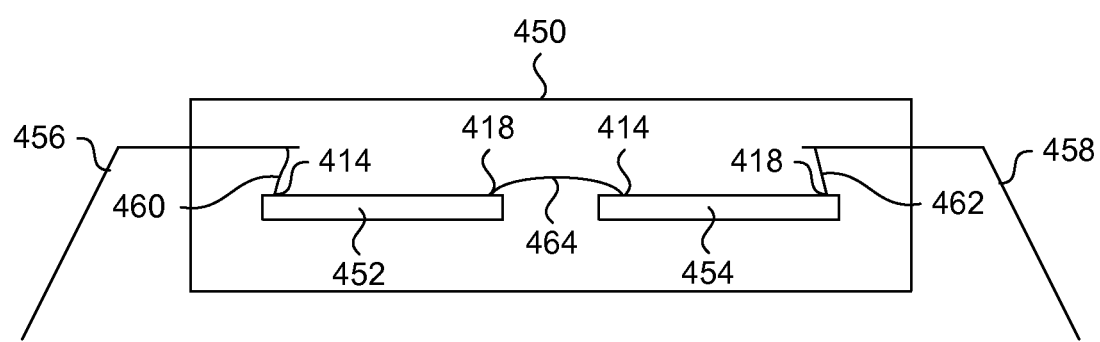
FIG. 5B is an example illustration of a system in package device including serially connected memory dies.

FIG. 5B is a drawing showing a side view of a system in package (SIP) 450 encapsulating two memory dies 452 and 454 in one possible organization, where the memory dies 452 and 454 are the same as memory die 402 shown in FIG. 5A. Each memory die has data input pads 414 and data output pads 418. Also referred to as a multi-chip package, SIP 450 has data input pins 456, and data output pins 458. In the present view, only one of the data input pins, data output pins, data input pads and data output pads are shown. The two memory dies are positioned side-by-side, where memory die 452 has its data input pad 414 connected to data input pin 456 via bond wire 460 and memory die 454 has its data output pad 418 connected to data output pin 458 via bond wire 462. Memory device 452 has its data output pad 418 connected to the data input pad 414 of memory device 454 via bond wire 464. In such an organization, the internal wiring of bond wires 460, 462 and 464 are equivalent to the links 406/410 of the PCB 412. FIG. 5b shows one possible internal layout of the memory dies, and those skilled in the art will understand that the dies 452 and 454 can be stacked.

In the present examples of FIGS. 5A and 5B, the memory die has a physical device width, defined as the number of input data pads and output data pads formed on the die. The package width is the number of input data pins and output data pins on the package. These pins for the input port Sin[1:n] and the output port Sout[1:n] of the serial memory device that is the union of the package 400 and the memory die 402. The link width is the number of conductive tracks formed on the PCB. The memory die 402 of FIG. 5A has a x4 physical device width, as it is manufactured for receiving four input data streams through its data input pads 414 and for providing four corresponding output data streams through its data output pads 418. The package 400 has two input data pins 404 and two corresponding data output pins 408. The link width totals eight, but only the top two are connected to the pins of package 400. The maximum number of data input pads 414 and data output pads 418 of the memory die 402 that are active, or enabled, is physically limited by the maximum number of data pins 404/408 of the package 400. From this point on, reference to data pins or pads of memory die 402 and package 400 will include both data input and output pads and pins for the sake of convenience. Because the bottom two data pads 414/418 of the memory die 402 are not connected, they are dynamically disabled from use and the memory die 402 receives and provides data only from its top two data pads 414/418. In use, the bottom two data input pads 414 can be left open and the bottom two data output pads 418 can be bonded to a supply voltage such as VSS. Therefore for any system which includes this package 400, the active width can either be x1 or x2. The maximum active width for the present packaging example is x2, where a maximum active width refers to the data width of the system. Although memory die 402 of the present example is manufactured as a x4 die, the memory die 402 can be dynamically configured to operate at less than a x4 width. In the present example, if the memory die 402 in this package 400 is dynamically configured to operate a x4 width, then it would actually receive only half of the bits it was expecting. The system so configured would be non-functional.

Table 1 shows some example combinations of the link width, number of data pins on the package, the maximum number of usable data pads for a memory die manufactured with a total of 1, 2, 4 and 8 data pads.

| Physical Link Width | Physical Package Data Width | Memory Die Data Port Width | Maximum Usable Data Path Width |
|---|---|---|---|
| 1 | 1 | 1 | 1 |
|   | 4 | 1, 2, 4 | 1, 1, 1 |
|   | 8 | 1, 2, 4, 8 | 1, 1, 1, 1 |
| 2 | 1 | 1 | 1 |
|   | 4 | 1, 2, 4 | 1, 2, 2 |
|   | 8 | 1, 2, 4, 8 | 1, 2, 2, 2 |
| 4 | 1 | 1 | 1 |
|   | 4 | 1, 2, 4 | 1, 2, 4 |
|   | 8 | 1, 2, 4, 8 | 1, 2, 4, 4 |
| 8 | 1 | 1 | 1 |
|   | 4 | 1, 2, 4 | 1, 2, 4 |
|   | 8 | 1, 2, 4, 8 | 1, 2, 4, 8 |

The final column titled "Maximum usuable data path width" illustrates that for each combination of these characteristics, there is a maximum usable number of data pads for the device in a system. It is the largest integer that is smaller than or equal to each of the physical characteristics in the first three columns. For example, if the physical link width connecting this memory device to the next is 2 bits wide, the memory die is manufactured as x2 and encapsulated in a x4 package, then the maximum number of usable data pads is at most 2. All the combinations shown in Table 1 have the property that the physical package data width is greater than or equal to the memory die data width. However, the memory die data width can, in general, be greater than the package data width.

Therefore, the dynamic configurability of the memory device of the presently described embodiments allows for its use in a package having any suitable number of data pins. It is noted that there are configurations shown in Table 1 where the package has a greater number of data pins than there are active data pads in the memory device. In order to make the characteristics of the memory device directly available to the memory controller, the memory device includes one or more registers readable by the memory controller that encode those characteristics. In particular, the memory device includes an I/O Width Register that encodes the width of the Sin and Sout data ports on the die and makes this width available to the memory controller. Other embodiments may include the physical package width in this or another register as well. The primary distinction between these two classes of embodiments stems from the previously noted constraint found for example in Table 1 that the physical package width is greater than or equal to the memory die data width. If this constraint is present, then the I/O Width Register need only encode the memory die data width. If the constraint is not present then the I/O Width Register needs to either encode both the physical package data width and the memory die data with or the lesser of the two. Since it is undesirable to dedicate additional pins on the package for the purpose of setting the number of input and output data pins that are currently enabled, the die includes a Current Active Width Register. The die is configured dynamically according to the value stored in this register such that the number of input and output data pads that are enabled for use is equal to the stored value or an appropriate alternative value indicative of the current active data width. The remainder, if any, of the physical input and output data pads and their corresponding circuits are disabled. Based on physical link widths of the PCB and/or system considerations, the memory controller will then load the Current Active Width Register with the appropriate data for disabling unused data pads and directing all communication (in and out of the serial memory device) onto the remaining enabled data pads.

Figure 6:
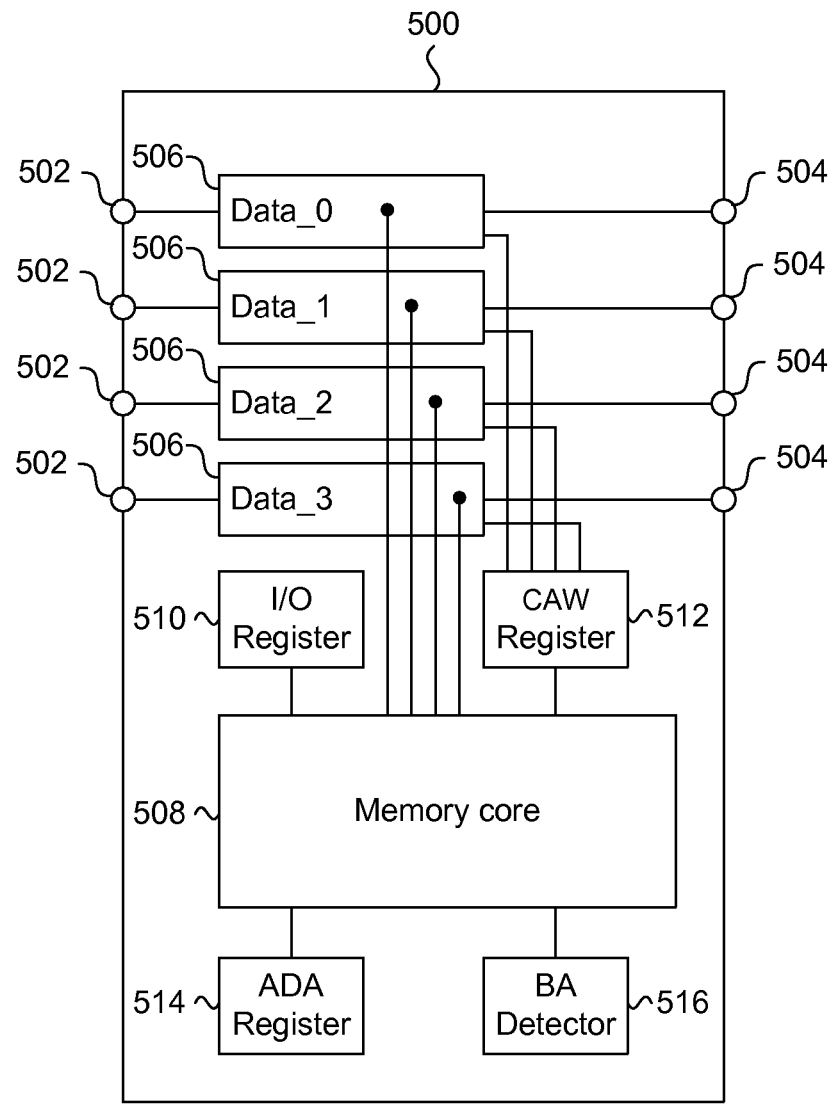
FIG. 6 is a block diagram of a memory device embodiment having configurable data widths.

FIG. 6 is a partial block diagram embodiment of a memory die having configurable data widths. The arrangement of the circuit blocks are not intended to represent a physical layout or positioning of the blocks in the manufactured die. This memory die can be used in the systems shown in FIGS. 3A and 3B. Memory die 500 is designed and manufactured as a x4 die, and therefore has four data input pads 502 and four corresponding data output pads 504. Each pairing of a data input pad 502 and a data output pad 504 is coupled to a data I/O circuit block 506. Logically, the top-most data I/O circuit block 506 is the least significant, and thereby labeled "Data 0". The remaining data I/O circuit blocks 506 are labeled in an order of increasing logical significance "Data_1", "Data_2" and "Data_3". Each data I/O circuit block 506 is coupled to the memory core 508, which includes the memory array, control logic, and other circuits that are necessary for proper operation of the memory die 500. Each data I/O circuit block 506 can pass input data through to its corresponding data output pad 504 and/or to the memory core 508. Read data from the memory core 508 can be provided to each data I/O circuit block 506 for output through the data output pads 504. Coupled to the memory core 508 are several registers, which include a I/O Width (I/O) register 510, an Current Active Width (CAW) register 512, an assigned device address (ADA) register 514, and broadcast address (BA) detector 516.

Typically the memory core 508 is organized as a very wide array with a great many data lines internally. Also typically, the wide internal data bus is coupled to a narrow I/O data path that couples the memory core to the data pads. The coupling between the wide memory data path and the narrow internal I/O data path is accomplished by the equivalent of a collection of bidirectional multiplexors that funnel bits to and from the narrow data path onto specific lines of the wide data path. There are several common mechanisms for implementing this multiplexing function that are well know to those skill in the art. In a previously considered memory device, the control of these multiplexors was derived in part from the address of the memory core access, and typically the column address in particular. However, in the serial memory device of the present invention, the control of these multiplexors is derived additionally from the contents of Current Active Width register. The routing between the wide internal data path and the narrow I/O data path to the I/O pads is thus dependent on the number of I/O pads currently in use. The nature of this control is well know to those skilled in the art as it is analogous to the adjustment of the control of those multiplexors that is common when a single memory die design is able to be fuse programmed to be one of any number of fixed width devices during functional test or packaging. A analogous situation exists with regards to the problem of capturing the control and address portions of incoming commands. These portions, described subsequently in relation to FIG. 9, arrive on different data input pads according to the value stored in the CAW register. Consequently, the multiplexers that shunt incoming bits into the appropriate locations in registers that temporarily hold device addresses, op codes and memory array addresses must all also be controlled in part depending on the contents of the CAW register.

The I/O Width Register 510 is hardwired to store data indicating the maximum data width configuration of the memory die 500 and optionally the number of package pins to which its data pads are physically connected. Hardwiring includes setting a non-volatile data storage means that is sensed upon power up of the memory device 500. Such non-volatile data storage means includes fuses that can broken electrically or by lasers, and anti-fuses which can be electrically blown to create an electrically conductive link. Those of skill in the art will understand that any suitable non-volatile programming technique can be used. The CAW register 512 serves two purposes. First, when the desired data width configuration is determined by the memory controller, a configuration code is issued to all the memory devices in the system by the memory controller. This configuration code is loaded into the CAW register 512 to enable only data I/O circuit blocks 506 that are to be used, thereby saving power. This configuration code is further used by the control logic of the memory core 508, such as a command decoder, to ensure proper mapping of the received and provided data based on the current active data width configuration of the memory device 500. During initial power up of the memory device 500, the default current active data width configuration is set to the minimum possible setting, which is x1. In a default x1 current active data width setting, only the data I/O circuit block 506 corresponding to logical position Data_0 is enabled.

The ADA register 514 stores an assigned device address issued by the memory controller, thereby allowing the memory device 500 to act on commands specifically addressed to it. Accordingly, the same configuration code can be issued to each memory device in the system by issuing commands addressed to each memory device. Such a global operation can be more efficiently done by broadcasting the configuration code to all the memory devices, regardless of their assigned device address. As will be described later, the memory device 500 can be preset to recognize one address, referred to as a broadcast address, which will never be assigned to any memory device but is recognized by all the memory devices. Optionally, the broadcast address can be dynamically determined based on the number of memory devices in the system and the device addresses that have been assigned. Therefore, this broadcast address is stored in a register of BA detector 516 for comparison with the address associated with an incoming command.

Accordingly, memory devices organized according to FIG. 6 can be used in systems such as the ones shown in FIGS. 3A and 3B. In some examples, all the memory devices in the system are functionally identical, meaning that they have the same package and memory device within it. However, a mix of memory devices can be included in the system of FIGS. 3A and 3B. Though it is possible and desirable that all the memory devices in the system have the same physical package width and the dies have the same data width, this is not necessarily the case. A collection of memory devices can be placed in a system according to FIG. 3A or 3B even if they have different characteristics.

Figure 7:
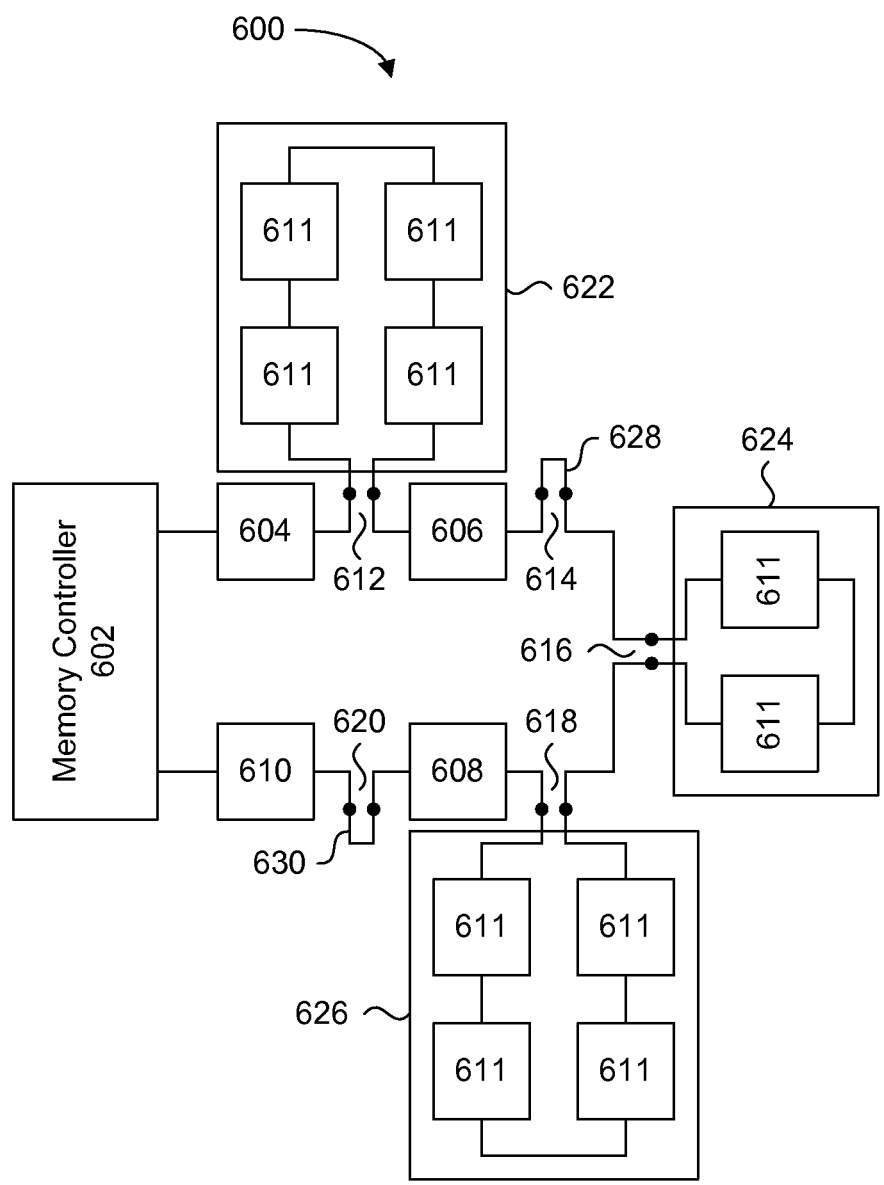
FIG. 7 is a block diagram of a dynamically adjustable system embodiment.

According to one embodiment, the system includes the ability to add or remove one or more memory devices during system build or in the field. FIG. 7 is a block diagram illustrating a dynamically adjustable system embodiment. Adjustable system 600 includes a memory controller 602, fixed memory devices 604, 606, 608 and 610, expansion links 612, 614, 616, 618 and 620, and expansion modules 622, 624 and 626. Fixed memory devices 604, 606, 608 and 610 are serially connected to each other, to intervening expansion links, and to the memory controller 602. Each expansion link is a male, female or androgynous coupling means for releasably receiving and retaining a module having a corresponding coupling means. Each module includes at least one fixed memory device 611 serially connected with the terminals of the expansion link. In the presently shown example, expansion modules 622 and 626 each include four memory devices that are serially connected between input connectors and output connectors of the module coupling means. Module 624 includes two memory devices serially connected between input connectors and output connectors of its module coupling means. Therefore, by inserting the module into an expansion link, additional serially connected memory devices can be dynamically inserted between fixed memory devices. Unused expansion links, such as expansion links 614 and 620 will have suitable jumpers 628 and 630 connected thereto for maintaining a continuous serial electrical connection of the chain.

The adjustable system 600 can include any suitable number of fixed memory devices and expansion links, and the memory modules can include any suitable number of serially connected memory devices. Therefore, the adjustable system 600 is fully expandable in memory capacity simply by adding new modules or replacing existing modules with larger capacity modules, without impacting overall performance. There is no requirement to change the memory controller, since the same channel is being populated with additional serially connected memory devices, and those skilled in the art will understand how to connect parallel control signals such as CE#, RST# and power supplies to the inserted modules. After insertion of the modules, or removal of modules, the memory controller may initiate automatic device ID generation for the new set of memory devices in the system 600.

Figure 8A:
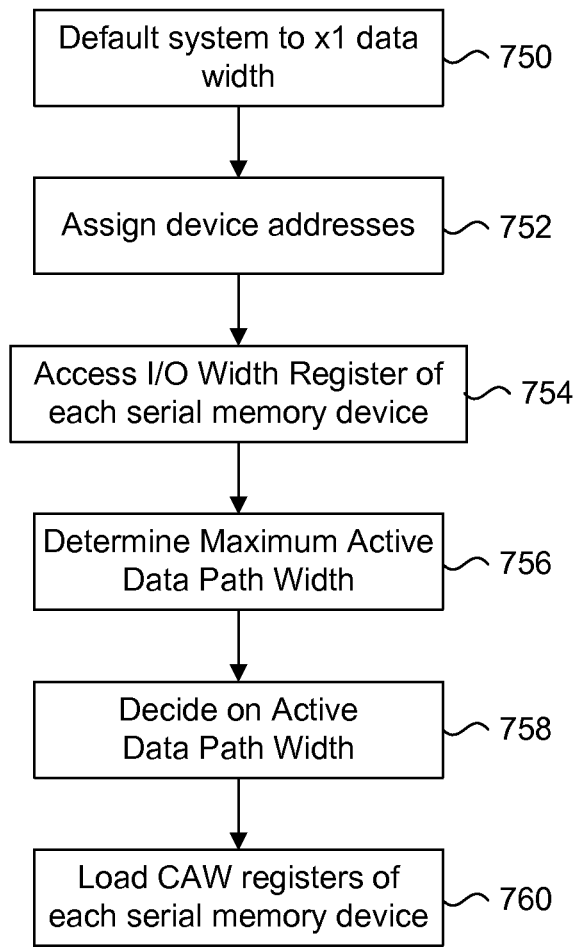
FIG. 8A is a flow chart of a method for setting an active data width of a system, according to a presently described embodiment.

In such an embodiment, there can be a mixing of memory devices in the system, where different memory devices may have different physical package data widths and die data widths. Accordingly, a maximum active data path width of the system 600 is the smallest of the link widths, package widths and die widths amongst all the memory devices. Before normal memory operations can begin, the maximum active data path width of the system is determined. Once this maximum active data path width of the system is determined, then all the memory devices operate with a current active data width that is equal to or less than the maximum data width. The determination of the maximum data width of the system and setting of the active data width is done by the memory controller. FIG. 8A is a flow chart outlining a method for setting a current active data width of the memory devices of a system, according to a presently described embodiment. This method will be described with reference to the example system shown in FIG. 8B.

Figure 8B:
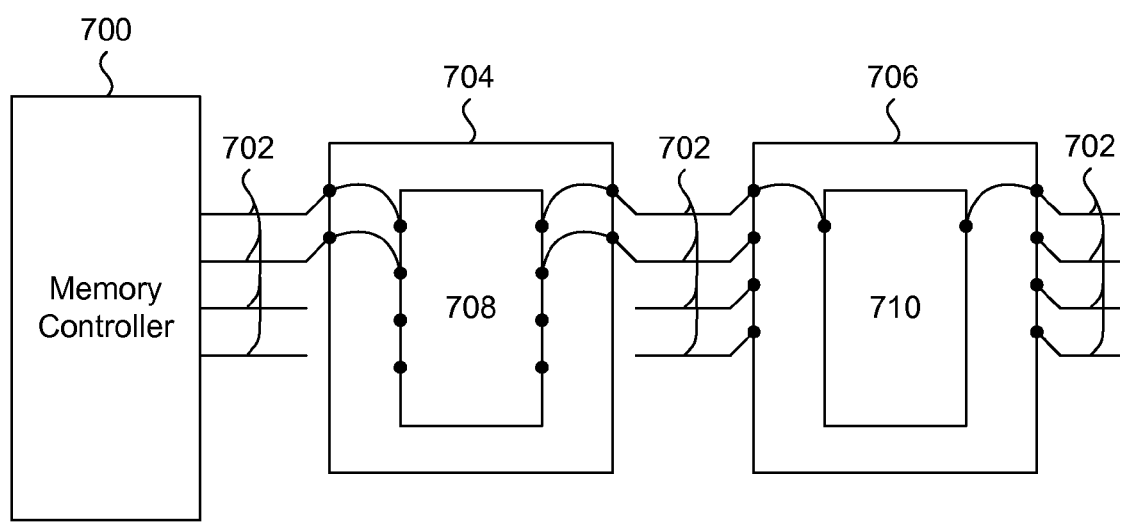
FIG. 8B is an illustration of an example system having configurable data widths.

The method of FIG. 8A is performed as part of a power up initialization routine of the system of FIG. 8B. It is assumed that the memory controller 700 is configurable up to a x4 data width, and therefore has four data output ports electrically connected to four physical conductor lines 702 implemented on the PCB of the system. While not shown in FIG. 8B, memory controller 700 has four data input ports connected to four physical conductor lines that are directly connected to the data output ports of the last memory device. Each memory package 704 and 706 has its data pins bonded or selectively coupled to the conductor lines 702 of the PCB. In order to simplify the schematic, the data return path from the last memory device to the memory controller 700 is omitted, as are the control signals used by the memory devices. Memory package 704 has two input and output data pins while memory package 706 has four input and output data pins. The memory device 708 is manufactured to be x4, and only has its first two input/output data pads bonded to the pins of package 704. Memory device 710 is manufactured to be x1, and has its input/output data pad bonded to the top pin of package 706.

The method begins upon power up of the system, whereby all the memory devices default to the x1 active data width configuration, and the memory controller defaults to output data in the x1 data configuration in step 750. In this configuration, it is assumed that the top-most pin is the logical Data_0 position, which is used for the default active data width configuration. In the x1 link width all the memory devices will receive data issued by the memory controller. The memory controller will then perform ID number generation at step 752 in accordance with the techniques disclosed in the previously mentioned commonly owned U.S. patent applications directed to memory ID number generation. After the ID numbers are assigned and stored into respective ADA registers 514 of each memory device, the memory controller will individually access the I/O Width Registers 510 of each memory device by issuing a corresponding command at step 754. The memory controller will then assemble all the I/O Width Register data and mathematically determine the smallest of the link widths, package widths and die widths across all the memory devices in the system at step 756. In the system of FIG. 8B for example, memory device 708 has an active data width range of two, and memory device 710 has a maximum active data width of one. Since memory device 710 does not have a second data pin, the common active data width is one.

The I/O Width Registers inform the memory controller of the Physical Package Data Width and/or the Memory Die Data Port Width of each of the serial memory devices in the ring. If both are not provided, the lower bound of the other can necessarily be deduced by convention from the one that is provided. In order determine the Maximum Usable Data Path Width, the memory controller must also know the minimum link width around the system. The most straight forward way for it to comprehend this is to specify that the link segments must be no narrower than the memory controller's data port width, which it intrinsically knows. An alternative is to require that all link segments be of the same width and that the memory controller be able to determine the link with of the link segment connected to its Sin input port by the placement of weak (i.e. large resistance) pullup or pulldown resistors on those inputs connected to a link trace 406, and the opposite for those not. By sensing the voltage on its inputs when the ring is disabled (via the CE# signal), the memory controller can thus determine the minimum link width around the ring and thereby compute the maximum usable data path width around the entire ring. Yet another alternative of many is to rely on the convention that all link widths will be necessarily wider than the narrowest serial memory device in the ring. With this assumption in place, the memory controller can determine the maximum usuable data path width solely on the Physical Package data Widths and/or the Memory Die Data Port Widths of the devices in the ring.

At step 758 the memory controller 700 will apply a preferred operating profile to set the final active data path width for the system to be some value less than or equal to the Maximum Usable Data Path Width. For example, one operating profile can be for high performance, a second can be for minimized power consumption, and a third can be a balanced performance and power profile. In the high performance profile the maximum data width is selected. On the other hand, the minimized power consumption profile may dictate that the minimum data width (ie. x1) be selected. The balanced performance and power profile may be a value below the maximum data width of the system. An adaptive profile would cause the active data path width to be changed during the course of normal operation or at transitions from one system-level power or performance state to another, depending on specific performance, power and thermal constraints or optimizations. For example, the active data width might be changed from a large value to a smaller one as part of a general throttling of the system as a result of thermal overtemperature event. Once the memory controller 700 or software running on the host system 12 has determined the common active data width to be used, each memory device is accessed at step 760 to load its CAW register 512 with the appropriate configuration code. This can be done by broadcasting command to load the CAW registers 512 of all the memory devices with the common active data width. This must be done with a broadcast command or some other comparable mechanism that changes the active data path width of all serial memory devices essentially simultaneously because the ring cannot operate properly, even temporarily, if any two adjacent devices on the ring do not have the same view of the current active width of the link connecting them. In the present example of FIG. 8B, the maximum usable data width of the system is x1, thus memory device 708 remains at the default x1 data width while memory device 710 remains at the default x1 data width. In the example of FIG. 8B, step 758 is not required if all the memory devices have a maximum data width of x1. Similarly, in this case, step 760 is optional since all the serial memory devices are already operating as x1 devices per step 750.

Now that all the memory devices have been configured to have the determined active data width, further initialization operations or normal operations can proceed. It is beneficial to perform the method of FIG. 8A prior to other initialization operations because subsequent operations can be executed more quickly if the active data width is set to be greater than the default x1 configuration. A mix of memory devices having different physical package and die pad data width configurations can be used together in the same system. In the embodiment of FIG. 7, the method of FIG. 8A is performed upon power up each time after expansion modules are removed or added.

As previously mentioned, broadcasting is a technique for simplifying the distribution of common commands to all the memory devices in a system. Without broadcasting, separate commands are issued to each memory device by device address. This requires more time and overhead in the memory controller, as it needs to keep track of which devices have already been issued the command. If the memory controller cannot be interrupted safely, then there may be memory devices that do not receive the command. In the systems of FIGS. 3A and 3B, any command packet issued by the memory controller will propagate through all the memory devices, and only the memory device having an assigned device address matching the device address in the command will act upon the command. All other memory devices will ignore the command. In the presently discussed broadcasting technique, the memory controller issues one command packet that is acted upon by each memory device as it propagates through all the memory devices. Therefore memory controller operations are greatly simplified.

Figure 9:
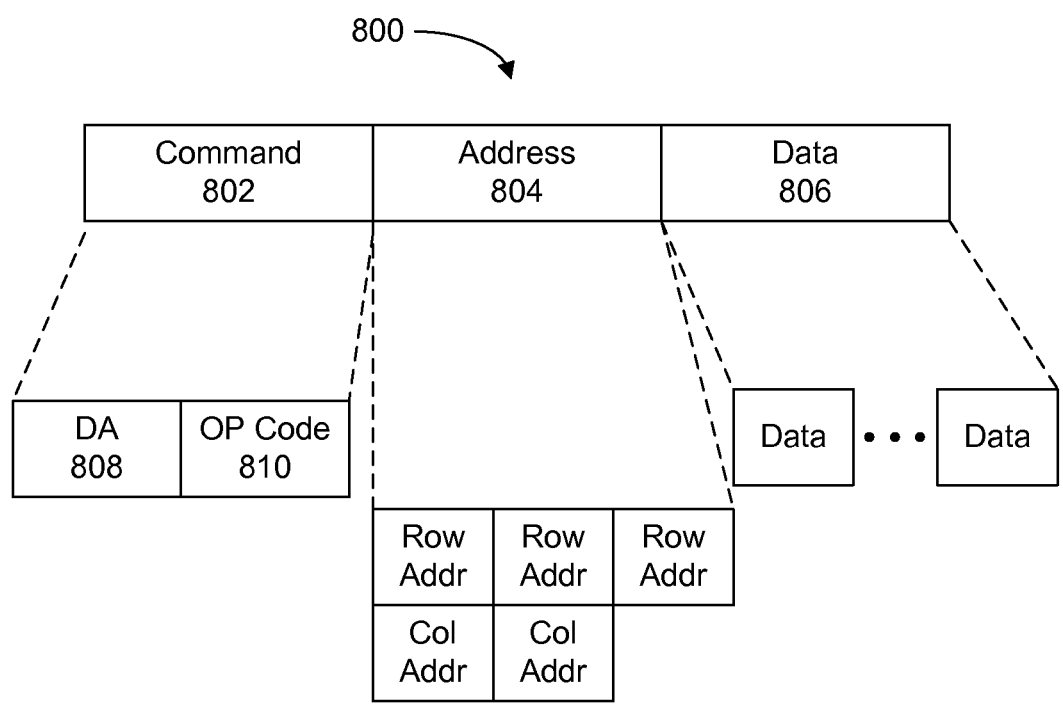
FIG. 9 is an illustration of a modular command packet structure for the systems of FIGS. 3A and 3B.

The command packet 800 has the structure illustrated in FIG. 9, and includes three fields, two of which are optional depending on the specific command being issued by the memory controller. The first field, being a mandatory field, is the command field 802. The first optional field is an address field 804, and the second optional field is a data field 806.

The command field 802 includes two sub-fields, the first being a device address (DA) field 808 and the second being an op code field 810. The device address field 808 can be any suitable number of bits in length, and is used for addressing each memory device in the system. For example, a device address field 808 of 1 byte (8 bits) in length is sufficient for addressing up to 256 ($2^8$) memory devices, however the device address field 808 can be any desired length. One address can be reserved for addressing all memory devices simultaneously, i.e. for broadcasting an operation. In an alternate embodiment, the device address field 808 can include a device type field to indicate the type of memory device the op code field 810 is directed to. For example, the device type field can designate a DRAM, SRAM or flash memories. The op code field 810 can be any suitable number of bits in length to represent the commands for any suitable number of memory devices, and can include a bank address. For example, the flash memory command set will have different commands than a DRAM command set in view of inherent differences, hence the op code field is assigned to functions accommodate all possible commands from both command sets if the system includes both types of memory devices. However, a preferred alternative for dealing with different types of memories is to have the op code space divided into two collections of commands: those commands related to ring operation and those related to memory array operations. The former set can be consistent across all memory types, but the second group need not be. The semantics of the op codes in this group would be memory type specific. For example, a particular op code that meant program when issued to a Flash memory might mean refresh when presented to a DRAM. Since the memory controller must know what kind of memory is at each assigned device address, it does not matter if these functions share the same op code. The address field 804 is used for providing either a row address (Row Addr) or a column address (Col Addr) or a full address of a memory array, depending on the type of operation specified by the op code. The data field 806 will include any suitable number of bits of data to be written or programmed to the memory device. Therefore, the command packets 800 will vary in size since write data may not be required for a particular operation and both addresses and write data may not be required for a particular operation.

FIG. 10 lists example command packets which can be used for operating a flash memory device having the organization shown in FIG. 4, for use in the previously described systems of FIGS. 3A and 3B. The byte positions in FIG. 10 correspond to the order they are serially received by the memory device. The command field 802 occupies the first and second byte positions, which includes the device address (DA) as the first byte of information and an op code corresponding to the operation as the second byte of information. The op code is represented as a hexadecimal value, and the "X" indicates that the last half four bits of the byte can be any value. In the particular case of the Flash op codes of FIG. 10, the 4 unused bits represented by the "X"s in the second nibble of the op code byte for some commands are the location of a bank address. In this way, conceptually some commands are directed at the serial memory device, and some are directed at specific banks within that device. This structuring of the op code space facilitated bank-to-bank parallelism and concurrency within a single serial memory device. The address field 804 can include a three-byte row address (RA) occupying the third to fifth byte positions, but may be shortened for other commands to include a two-byte column address (CA) occupying only the third and fourth byte positions. For commands including a two-byte column address, the data field 806 will occupy the fifth byte position to the $2116^{th}$ byte position or beyond, if the data should be that length. The data can occupy an arbitrary number of byte positions.

Any command packet 800 issued by the memory controller is received serially by each memory device in the system, and only the memory device having an assigned device address matching the DA sub-field 808 of the command field 802 will act upon the op code sub-field 810. The command packet is passed through the memory device and to the next memory device in the chain. Since the op code is specific to a particular operation, the interface and control logic block 308 of the memory device 300 of FIG. 4, will control the required circuits for latching address and/or data information of the command packet. For example, if a page read command packet is received by the designated memory device, the designated memory device will decode the op code and control the appropriate circuits to latch the following three byte row address. The example command packets listed in FIG. 10 are directed to flash memory operations. A set of command packets for any other type of memory device having different operations can follow the described command structure. If the DA sub-field 808 is n-bits in length, then up to $2^n$ total device addresses can be provided, thereby addressing up to $2^n$ memory devices. In the presently described embodiments, $(2^n)-1$ of the addresses are assigned to a corresponding number of memory devices, and one of these addresses is reserved as the broadcast address.

In FIG. 10, the "Operation Abort" command is shown to be directed to a specific memory device. However this command can be broadcast to all the memory devices by setting the $1^{st}$ byte to hexadecimal address FFh. In the present example, it is assumed that address FFh is an unassigned DA reserved for broadcasting commands. The abort operation is analogous to a soft reset, in which all operations in progress are halted to return the memory device to a standby state. The "Write CAW Register" command is shown as a broadcast command in that the device address in this command in FIG. 10 is FFh. This command is used in the aforementioned method of FIG. 8A for loading the CAW register 512 with the selected active data width configuration code. Although not shown in FIG. 10, test commands for placing all the memory devices into preset test modes can also be broadcast.

In order for the memory devices of the systems shown in FIGS. 3A and 3B to respond to the broadcast command, simple logic circuitry is used to detect the predetermined broadcast address (BA). FIG. 11 is a circuit schematic illustrating one possible circuit embodiment of device address logic within each memory device of the presently described embodiments. With reference to the memory device shown in FIG. 6, this logic would be implemented within the memory core 508.

In FIG. 11, the device address logic 830 is responsible for generating a master enable signal EN for enabling other logic and circuits of the memory device to act upon the received command packet in response to either the designed device address or the broadcast address. Device address logic 830 includes the ADA register 514 for storing an assigned device address from the memory controller, XNOR logic 832, AND logic 833, OR logic 834, and the BA detector 516. The XNOR logic 832 receives all n-bits stored in the ADA register 514, and performs bit-by-bit comparison with the n-bits of the device address DA[1:n] of the command packet. The bus DA[1:n] communicates the device address of the current command once it has been entirely received. The amount of time needed to receive the device address portion of the command depends on the width of the field (1 byte in the example of FIG. 10), and the current active data path width, as encoded in the CAW register. The device address DA[1:n] is held temporarily in a register (not shown) at least until the command packet is entirely received. The XNOR logic 832 will generate n intermediate output signals corresponding to the comparison of the n-bit positions of the device address DA[1:n] with those of the ADA register 514. AND logic 833 receives all n intermediate output signals to generate a single enable signal en1 at the high logic level if all bit positions between the ADA Register 514 and DA[1:n] match. The broadcast address (BA) detector 516 receives the device address DA[1:n] and generates a single enable signal en2 at the high logic level if the BA matches the predetermined BA set for all the memory devices in the system. OR logic 834 receives both en1 and en2 to generate a high logic level master enable signal EN when either en1 or en2 rises to the high logic level. Therefore the memory device will respond to the command when the command packet includes a matching device address or broadcast address. As previously noted, the broadcast address can be preset and fixed, or dynamically assigned by the memory controller.

FIG. 12 is a circuit schematic of BA detector 516 according to one embodiment. In this embodiment, the broadcast address is preset and fixed and decoded by a decoder logic 836. In this example, the preset broadcast address is a collection of logic "1" bits, which represents the highest logical address. Therefore the decoder logic 836 is implemented as a NAND logic gate having n-inputs, each receiving one bit position of the device address DA[1:n]. Accordingly, en2 is at the low logic level if DA[1:n] are all logic "1" bits. the Those skilled in the art will understand that any decoder logic configuration can be used based on the pre-selected broadcast address, such that the enable signal en2 is driven to a logic level indicating a match between DA[1:n] and that pre-selected broadcast address.

FIG. 13 is a circuit schematic of BA detector 516 according to another embodiment. In this embodiment, the broadcast address is dynamically assigned by the memory controller and stored in the BA register 838. In this embodiment, the memory controller will address each memory device with a command for loading BA register 838 with the selected broadcast address. This command can be similar to the "Write CAW Register" command shown in FIG. 10. Once loaded, the n-bits of the BA register are compared to the n-bits of the received device address DA[1:n] with XOR logic 840. If all the bit positions match, then XOR logic 840 generates n intermediate output signals corresponding to the comparison of the n-bit positions of the device address DA[1:n] with those of the BA register 838. AND logic 842 receives all n intermediate output signals to generate single enable signal en2 driven to the high logic level when all the address bits of DA[1:n] match the corresponding bits of BA register 838.

The previously shown embodiments of the device address logic 830 and BA detector 516 are implemented with logic circuits that provide high logic level enable signals en1 and en2 when a matching device address or broadcast address is received. In alternate embodiments, inverted logic can be used such that enable signals en1 and en2 are driven to a low logic level when a matching device address or broadcast address is received.

Figure 14:
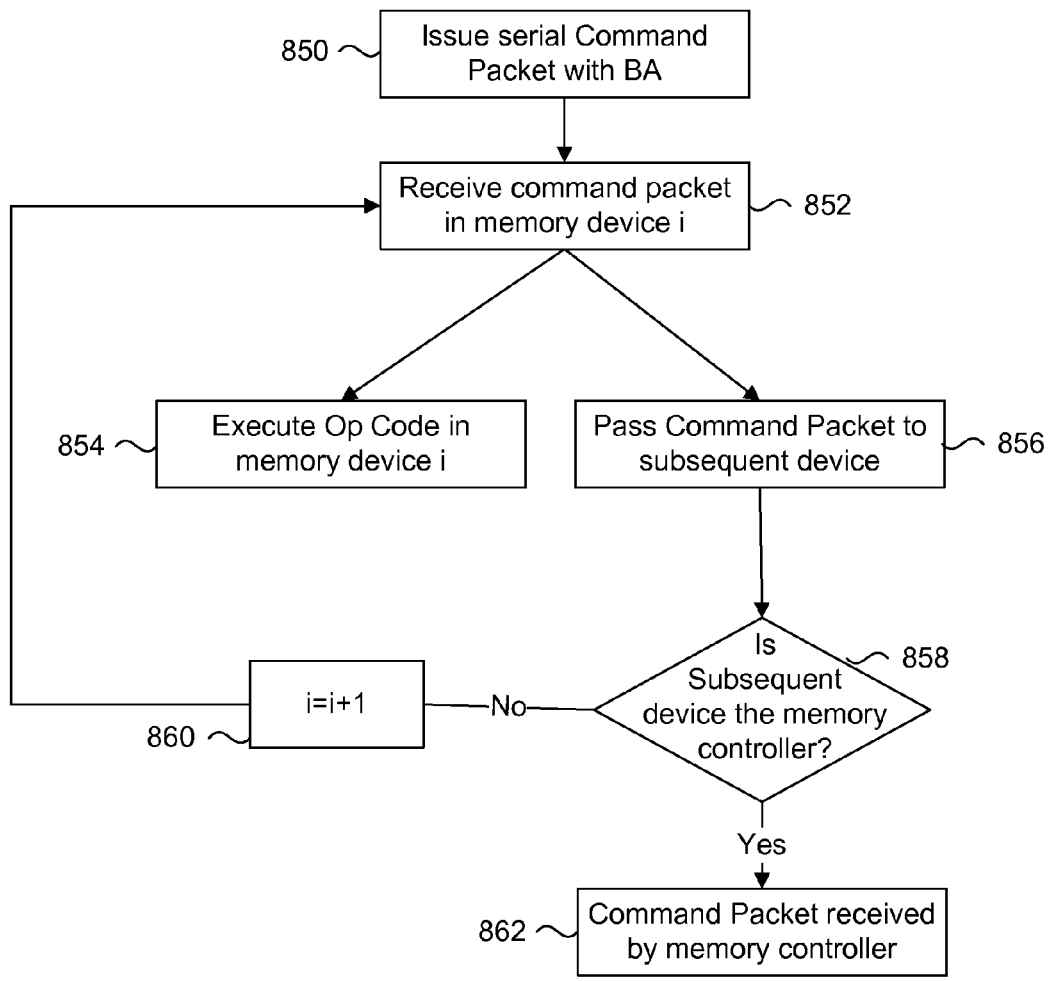
FIG. 14 is a flow chart of a method for executing a broadcast operation in the systems of FIGS. 3A and 3B, according to a presently described embodiment.

Therefore, the systems of FIGS. 3A and 3B can be addressed with a broadcast operation before and after device addresses have been assigned. The broadcast operation is initiated when the command packet is issued by the memory controller and completed when the memory controller receives its issued command packet from the last memory device in the system. FIG. 14 is a flow chart of a method for executing a broadcast operation in all the memory devices of the systems of FIGS. 3A and 3B. The broadcast method of the system starts at step 850 when the memory controller issues a command packet that includes the preset or assigned broadcast address, referred simply as the broadcast address from this point forward. The command packet is received by the first memory device in the system, referred to as memory device i, where i is an integer value greater than 0, at step 852. When received, device address logic such as device address logic 830 of FIG. 11 will match the broadcast address in the command packet with the stored broadcast address, or it will decode the broadcast address to determine if is the valid broadcast address.

Upon determining a valid or matching broadcast address, the memory device is enabled to perform the op code command of the command packet at step 854. At step 856 the command packet is passed to the subsequent device in the system, which may be a subsequent memory device or the memory controller. From step 858, the method loops back to step 852 when the subsequent device is another memory device. Parameter i is incremented at step 860 to indicate that steps 852, 854 and 856 are performed by the next subsequent memory device in the system. Eventually, the method will proceed to step 862 from step 858 when the last memory device in the system passes the command packet to the memory controller. At step 862 the memory controller receives the command packet it originally issued, and the broadcasting operation is effectively ended since all the memory devices have received and acted upon the command packet. Therefore, all the memory devices will perform the operation with a single issued command from the memory controller. The steps of FIG. 14 are performed strictly sequentially in that it is not the case that one step does not begin until after the previous step is complete. For systems of FIGS. 3A and 3B, the arcs of FIG. 14 indicate logical or conceptual sequence of events and not necessarily the actual order of the events. Since the duration of each step can be longer than the gap between the initiation of subsequent steps, indicating that multiple steps can be occurring and they can even appear to happen out of order. For example, step 854 cannot begin until all of the op code bits of a command packet have been received. If the current active data path width is x1, this can be many clock cycles from the start of the packet. However, forwarding the command packet to the next device (step 856) begins almost immediately. In fact, with a narrow current active width and a ring with a small number of serial memory devices, in the beginning of the command packet can have gone all the way around the ring before the first device has received all of both of the device address and the op code.

In the systems of FIGS. 3A and 3B, the issuance of commands is accompanied by the assertion of the command strobe input CSI. CSI is used for controlling the capturing of command packets appearing on the input port Sin as they flow through the serial memory device to the output port Sout. and the assertion of CSI has a pulse duration corresponding to the length of the command packet received. Hence the protocol for issuing commands by the memory controller in the present system embodiments is straightforward, since the memory controller designer need only ensure that a CSI pulse is synchronized with the command packet that is issued. Some commands that are issued will instruct the addressed memory device to provide output data. After a predetermined amount of time, the output data will be ready for output, meaning that the read data has been loaded into a read data register during internal memory read operations. The serial memory device is said to be selected and ready to output data. The read protocol for executing a read operation in the presently described system embodiments specifies that a data strobe input DSI pulse is issued after the CSI pulse with the read command packet. DSI is used for enabling the output circuits for the Sout output port, such as data I/O circuit block 506 of FIG. 6, to output read data, and has a pulse duration corresponding to the length of the read data being requested. More specifically, the DSI pulse will enable data from the read data register to be clocked out through the Sout output port via data I/O circuit block 506. For each device, CSO and DSO are time shifted versions of CSI and DSI, provided so that the next device in the ring can capture commands and data appropriately.

Figure 15:
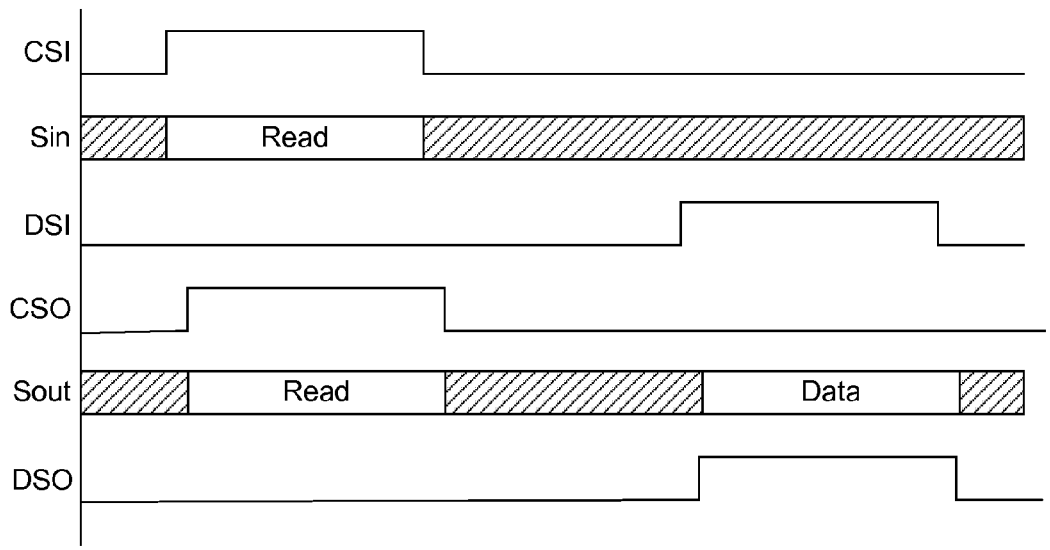
FIG. 15 is a sequence diagram illustrating an example valid read operation for the systems of FIGS. 3A and 3B, according to a presently described embodiment.
Figure 16:
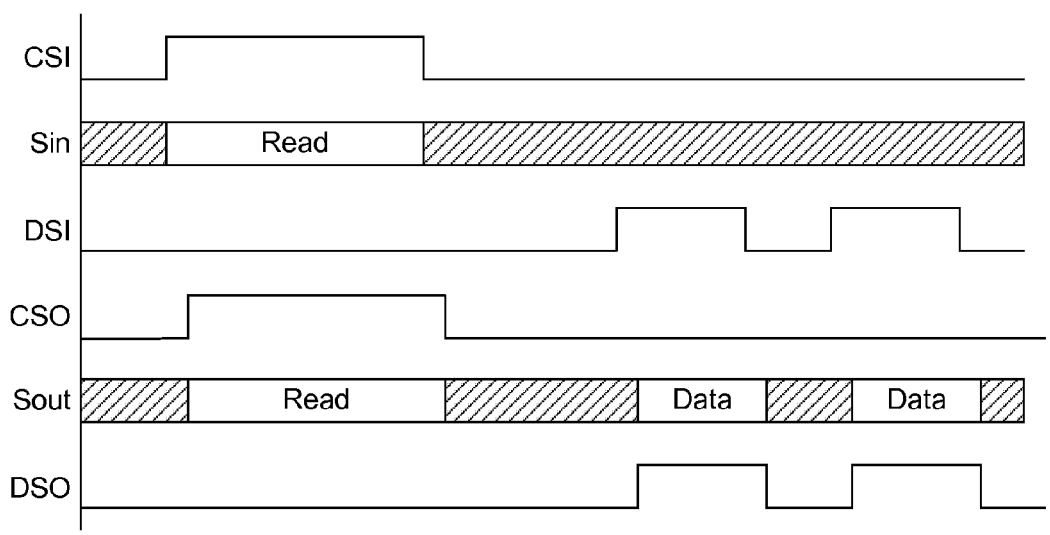
FIG. 16 is a sequence diagram illustrating an example valid read operation for the systems of FIGS. 3A and 3B, according to a presently described embodiment.

FIGS. 15 and 16 are sequence diagrams illustrating valid read operations performed by a memory device in response to control signals CSI, DSI and a read command packet. In FIG. 15, CSI is pulsed for the duration of an issued read command packet. The incoming Read command is sent onto the Sout port at the same time as it is being interpreted. As an optional optimization, once the read command is recognized as being addressed specifically to the present device (i.e. DA byte=ADA register) forwarding of the command to the next device in the ring can stop at any legal command length boundary. The read command packet can include any of the commands listed in FIG. 10 where some type of information is to be read out from the memory device. If the read command packet is addressed to the last memory device in the system, then the CSI pulse and the read command packet are passed through each intervening memory device, and is then acted upon by the last memory device. After a minimum time period necessary for the memory device to prepare the read data has passed, the memory controller can issue a DSI pulse. This pulse is passed through the intervening memory devices, and is only acted upon by the selected last memory device. Data is then clocked out on the Sout output of the selected last memory device for the duration of the DSI pulse, aligned with a corresponding pulse of DSO. It is noted that the data is provided after a delay relative to the rising edge of DSI. In the presently described embodiments, this delay is a single clock cycle, but can be any number of clock cycles depending on the design and configuration of the memory device. For both the forwarding of the command and the output data, the corresponding CSO and DSO strobes are output concurrently with the data on Sout.

In FIG. 16, CSI is pulsed for the duration of an issued read command packet, where the read command corresponds to a burst read command for example. After a minimum time period necessary for the memory device to prepare the read data has passed, the memory controller can issue a first DSI pulse to enable the selected memory device to output a first portion of the read data. The first DSI pulse is de-asserted by driving it to the low logic level to temporarily halt, or pause data output. This may be done for example, in order to accommodate other system operations. Then the memory controller can issue a second DSI pulse to enable the selected memory device to output a second portion of the read data, which can be the remaining portion of the data stored in the serial data register 902. This second DSI pulse can be de-asserted, and a third DSI pulse can be issued to complete the data output for the remaining data. According to the presently described embodiment, output data on the Sout output of a selected memory device is clocked out in response to a received DSI strobe only when the previous CSI strobe is associated with a read command for the selected memory device, as indicated by a matching device address and an appropriate op code byte. In both the sequences of FIGS. 15 and 16, at least one DSI pulse immediately follows a CSI pulse for a read command. If DSI is asserted by the memory controller after any non-read command packet addressed to the present serial memory device or any command packet address to another serial memory device, output circuits for providing read data from the memory of the selected memory device are inhibited from providing any read data. Since read data is provided in response to DSI, the memory devices can ignore any DSI assertion that follows an asserted CSI for a non-read command packet to the present serial memory device. In alternate embodiments, the rules for what constitute a valid DSI input can be different. For example, if the command protocol allows a non-read command to one device to not disturb the another device that is selected for data output, then a DSI pulse can be directed to another serial memory device on the ring that is potentially either before or after it on the ring. In this case, the bits received on the Sin port during such a DSI pulse need to be copied to the Sout port so as to not interfere with communication between the memory controller and other serial memory devices. It will be understood by those skilled in the art that a variety of command protocols are possible with different rules for ignoring or forwarding CSI and DSI pulse and the contents of Sin.

Figure 17:
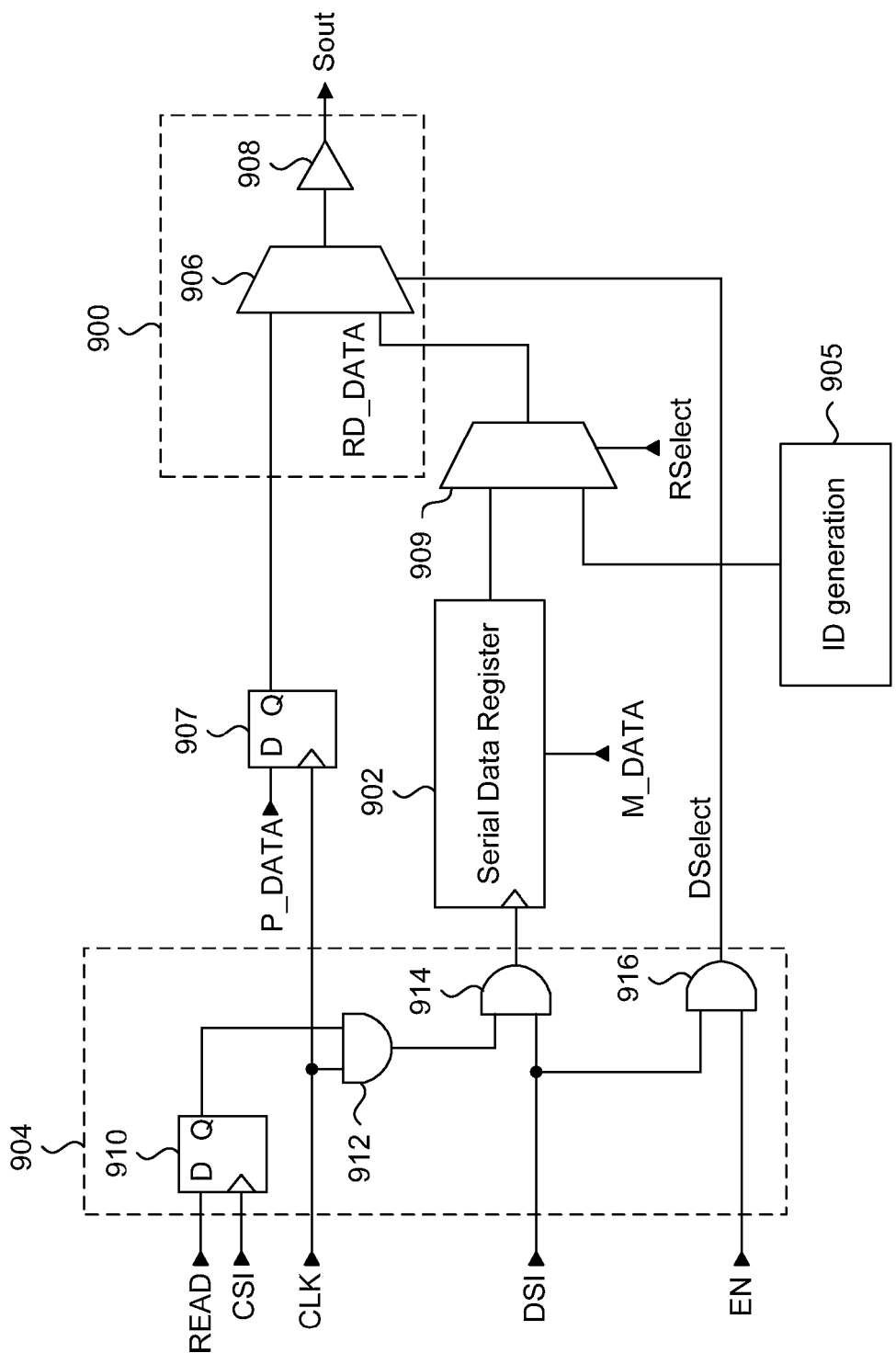
FIG. 17 is a circuit schematic embodiment of data output control logic and data output circuits of the memory device shown in FIG. 6.

FIG. 17 is a circuit schematic showing data output control logic and data output circuits which can be implemented in the memory device 500 of FIG. 6. The data output control logic is an example illustrating how the data output circuit can be disabled, or inhibited, from providing internal read data. Those skilled in the art will understand that other logic structures can be developed for achieving the same desired result. FIG. 17 shows a data output selector 900, a serial data register 902, a read data output controller 904, and an ID generation block 905. In the presently described embodiment, the data output selector 900 is implemented in each data I/O circuit block 506 of FIG. 6, and includes a multiplexor 906 that receives internal read data RD_DATA received from the serial data register 902, and pass through data P_DATA from an Sin input port of the memory device via latch 907. Multiplexor 906 will pass either P_DATA or RD_DATA in response to data selection signal DSelect. The selected output is then driven by output driver 908 onto output port Sout. Pass through data P_DATA is a serial stream of data that is received by other logic circuits, which are not shown to simplify the schematic. These other circuits will pass write data to the memory array and command data to the command decoder of the memory device. RD_data is provided from multiplexor 909, which passes data from either serial data register 902 or data from ID generation block 905 in response to register select signal Rselect. Register select signal Rselect is provided from the command decoder in response to a command for reading a particular register. ID generation block 905 includes the registers discussed in FIGS. 6, 11, 12 and 13, other registers for providing status information, as well as additional logic circuits for providing an updated ID number. For example, when the memory device is assigned an ID number, ID generation block 905 generates an updated ID number that is passed to multiplexor 909 during the ID generation phase of operation. This updated ID number is then passed through multiplexors 909 and 906 and onto Sout for the next memory device.

The serial data register 902 can be part of each data I/O circuit block 506 or the memory core 508 of FIG. 6, but in the presently described embodiment the serial data register 902 is a part of the memory core 508. Serial data register 902 can be any type of data register that outputs data serially in response to transitions of an input clock. It can be loaded with data read from the memory array M_DATA either serially or in parallel. Persons of skill in the art will be familiar with the different types of serial registers that are known in the art, which can be used in FIG. 17.

The read data output controller 904 is responsible for controlling the serial data register 902 during valid and invalid sequences of the CSI and DSI control signals. The read data output controller 904 includes a latch 910, and AND logic circuits 912, 914 and 916. Latch 910 receives signal READ which is latched in response to a high logic level of CSI. It is noted that both latch 907 and 910 are level sensitive latches. The READ signal is set to a high logic level when a received command is addressed to the present serial memory device and corresponds to any type of read operation, but is set to a low logic level when the received command either is addressed to another serial memory device or is not any of the recognized read operations. Since the command decoder will decode the received command for an addressed memory device to perform read and write operations, the generation of READ should be easily achieved with well known logic. The output of latch 910 is received by a first input of AND logic circuit 912, which receives an internal clock signal CLK at its second input. The internal clock signal CLK can be synthesized within the memory device in response to an external clock, or a buffered version of an external clock. AND logic circuit 912 will either pass CLK or a low logic level output depending on the output of latch 910.

CLK is used by other internal circuits of the memory device, including the serial data register 902 for clocking out loaded data. AND logic circuit 914 has one input for receiving the output of AND logic circuit 912, and another input for receiving DSI. Therefore, when AND logic circuit 912 passes CLK, CLK is passed to the serial data register 902 when DSI is at the high logic level. Otherwise, the clock input of serial data register 902 remains at the low logic level. DSI is further used to control multiplexor 906. AND logic circuit 916 has one input for receiving DSI and another input for receiving an enable signal EN. In the presently described embodiment, enable signal EN is provided by device address logic 830 shown in FIG. 11, and is at the high logic level when either a broadcast address or matching device address is received by the memory device. In the presently described embodiment, AND logic circuit 916 will drive its output data selection signal Dselect to a high logic level when both DSI and EN are at the high logic level. Under these conditions, DSI has been asserted and the device address in the command packet matches that of the memory device. Accordingly, Dselect will control multiplexor 906 to pass RD_DATA. Otherwise, when DSI is not asserted and the memory device is not the addressed one, then multiplexor 906 is controlled to pass P_DATA.

The operation of the circuits of FIG. 17 is briefly described with reference to the sequence diagram of FIG. 15 to illustrate its operation during a valid assertion of DSI. First CSI is asserted by driving it to the high logic level, and a read command packet is received at the Sin input of the memory device. It is assumed that the command packet addresses the memory device to set EN to the high logic level, and the memory device performs internal read operations to load the serial data register 902 with read data M_DATA from the memory. Since the command packet is a read related command, signal READ is at the high logic level. With CSI at the high logic level, CLK is passed to AND logic circuit 914 but prevented from being coupled to serial data register 902. Later in time, DSI is asserted by driving it to the high logic level. As soon as DSI goes to the high logic level, DSelect will control multiplexor 906 to pass RD_DATA. With DSI at the high logic level, CLK is coupled to the serial data register 902 to clock out the stored data through multiplexor 906 to output driver 908. Accordingly, the data provided in the Sout output port is valid read data from the memory device. In the situation of FIG. 16 where DSI drops to the low logic level, and is then asserted again later, it is noted that AND logic circuit 914 will decouple the output of AND logic circuit 912 from the serial data register 902 when DSI drops to the low logic level. When DSI rises again, CLK is coupled to the serial data register 902 to continue serial data output.

Figure 18:
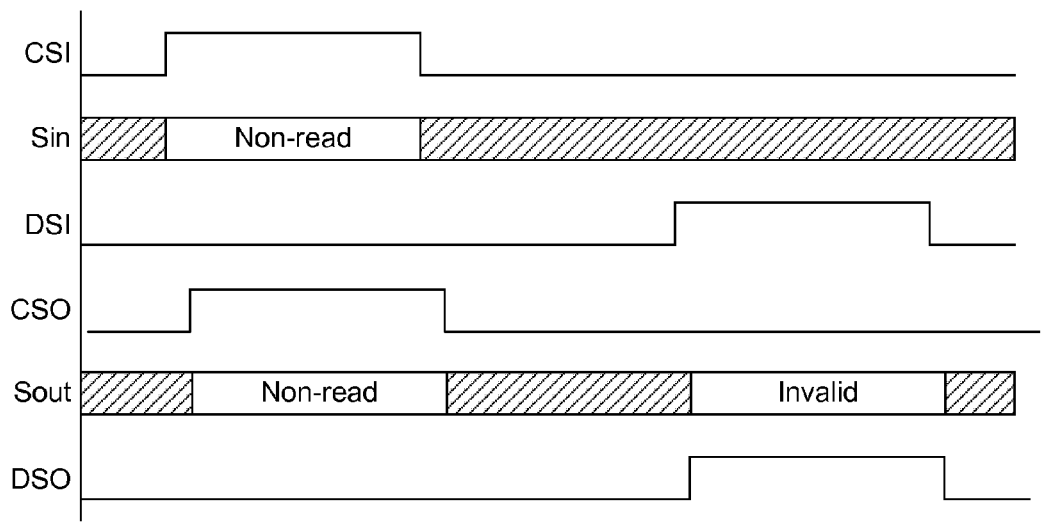
FIG. 18 is a sequence diagram illustrating an example invalid read operation.

The operation of the circuits of FIG. 17 is briefly described with reference to the sequence diagrams of FIGS. 18 to 20 to illustrate its operation during invalid assertions of DSI. In FIG. 18, CSI is asserted in association with a command packet that is not a read related command, where the non-read command corresponds to a write command for example, and is addressed to the memory device. Hence signal READ is at the low logic level, which is latched when CSI is at the high logic level. Therefore AND logic circuit 912 will inhibit CLK from being passed to AND logic circuit 914. When DSI is asserted later, AND logic circuit 914 will pass a static low logic signal to serial data register 902. Accordingly, DSI will have no effect on the serial data register 902 since CLK has been inhibited by AND logic circuit 912. Therefore RD_DATA will correspond to the data being held in the first register circuit of serial data register 902 coupled directly to multiplexor 906. By inhibiting DSI from the serial data register 902, any potential random data in the serial data register 902 is prevented from being asserted on the Sout output port. In one embodiment, the Sout output port is statically held at one logic level for the duration of the DSI pulse. Therefore, the memory controller can recognize a continuous sequence of "0" or "1" logic states as being the result of an invalid operation, that being the assertion of DSI after a non-read based command. It is noted that the addressed memory device will perform the non-read operation, such as a write operation for example.

Figure 19:
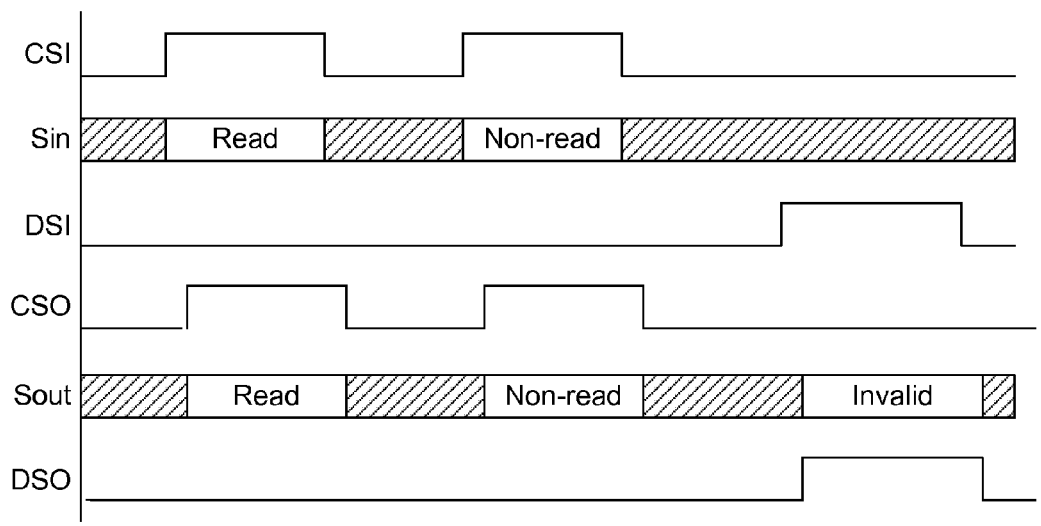
FIG. 19 is a sequence diagram illustrating another example invalid read operation.

In FIG. 19, CSI is first asserted in association with a read command packet addressed to the memory device. Accordingly, CLK is coupled to AND logic circuit 914 in the same manner as previously described for the sequence diagram of FIG. 15. Meanwhile, the memory device will internally perform the read operation and load the serial data register 902 with M_DATA. CSI is asserted again in association with an issued non-read command packet, such as a write command packet for example, addressed to the same memory device. Latch 910 will latch READ at the low logic level, resulting in AND logic circuit 912 inhibiting CLK from being coupled to AND logic circuit 914. When DSI is later asserted, DSelect will control multiplexor 906 to pass RD_DATA, but DSI AND logic circuit 914 does not receive CLK. Therefore serial data register 902 is disabled and does not output its contents, except for the bit of data stored in the first register circuit. In the presently described embodiment, it does not matter that the non-read command packet was addressed to a different memory device because the command decoder logic can remain active for setting READ to the high or logic level. In such a case the previously addressed memory device would not respond to the command and its multiplexor 906 is set to pass P_DATA even when DSI is asserted because EN is set to the low logic level. In the memory device addressed by the non-read command, its multiplexor 906 is set to pass RD_DATA, but its serial data register 902 will be disabled in the manner described for the situation described for FIG. 18.

Figure 20:
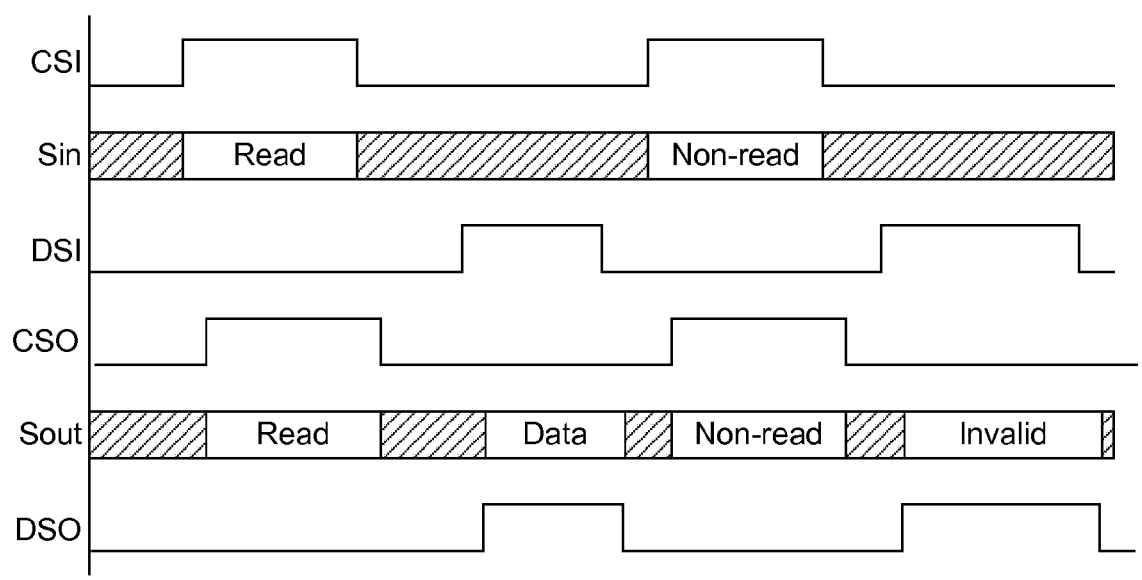
FIG. 20 is a sequence diagram illustrating another example invalid read operation; and, FIG. 21 is a flow chart of a data output inhibit algorithm, according to a presently described embodiment.

In FIG. 20, CSI is first asserted in association with a read command packet addressed to the memory device, where the read command corresponds to a burst read command for example. Accordingly, CLK is coupled to AND logic circuit 914 in the same manner as previously described for the sequence diagram of FIG. 15. DSI is asserted a first time after the initial CSI strobe with the burst read command. Multiplexor 906 is controlled to pass RD_DATA and serial data register 902 receives CLK to clock out its stored data through to the Sout output port. In the present burst read example, DSI is de-asserted by driving it to the low logic level to temporarily halt, or pause, data output. This situation is the same as the burst read operation shown in FIG. 16. However, instead of a second asserted DSI pulse, CSI is asserted after DSI is de-asserted in association with a non-read command packet, where the command corresponds to a write operation for example. This non-read command packet can be addressed to any memory device. In all the memory devices, latch 910 will output a low logic level to AND logic circuit 912, thereby inhibiting CLK from being coupled to AND logic circuit 914, and in turn inhibiting CLK from being coupled to serial data register 902. Therefore, any assertion of DSI following the assertion of CSI for the non-read command packet is ignored by all the memory devices. The Sout output port of the addressed memory device will statically provide data having one logic level for the duration of the DSI pulse.

Figure 21:
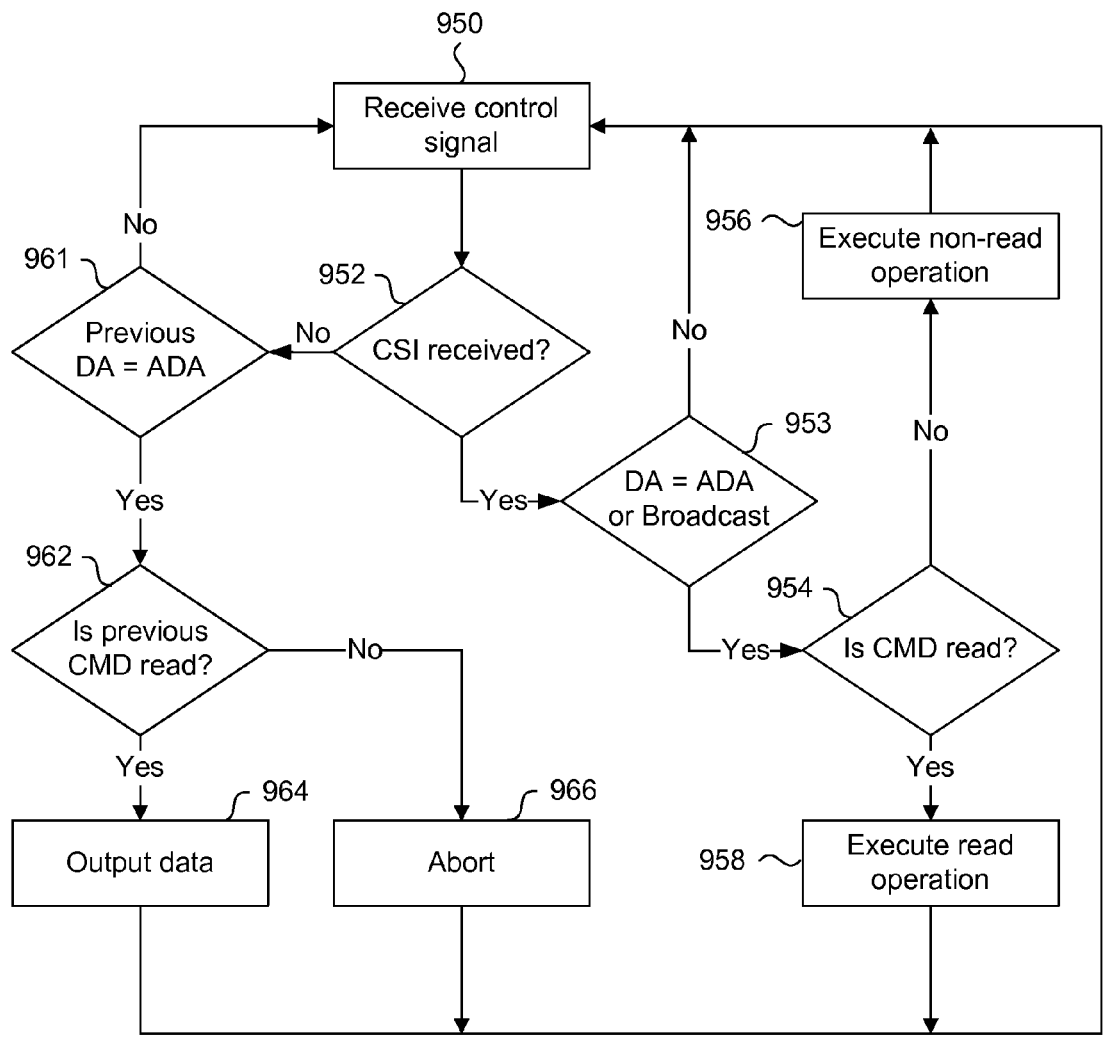

The valid and invalid issuance of the data output control signal, such as DSI in the presently described embodiments of the system of FIGS. 3A and 3B, can be summarized into a data output inhibit algorithm embodiment followed by each memory device. More specifically, the data output inhibit algorithm is followed by the command decoder of each memory device. FIG. 21 is a flow chart summarizing the data output inhibit algorithm according to a presently described embodiment.

The method begins at step 950 when a first control signal being either a DSI or a CSI is received by the memory device. If at step 952 the received control signal is a CSI signal with a corresponding command, then if the command is addressed to the present serial memory device as determined at step 953, then the method proceeds to step 954. From step 954, if the CMD is a non-read operation, then the method proceeds to step 956 to perform the non-read operation. Then the memory device returns to step 950 to wait for the next control signal. Returning to step 954, if the received CMD was a read related command, then the read operation is performed at step 958 to prepare the read data for output. The method then returns to step 950 when the next control signal is received. If the next control signal is an asserted DSI, the method proceeds from step 952 to step 962 via step 961 if the serial memory device was selected by the previous command. Step 961 verifies that the previous device address of the command matches the assigned device address. In that case, if the previously received CMD corresponded to a read command, then the read data is output at step 964 in response to the received DSI. If the next control signal is another DSI, then the method returns to step 964 to output further data. This particular loop may continue for any number of consecutive asserted DSI control signals, resulting in valid data output.

Returning to the scenario where the read command is performed at step 958, and another CSI is received with a corresponding non-read related command, the method proceeds from step 952 to 962, where it is determined that the command is non-read related. Then the data output operation is aborted at step 966. Hence any asserted DSI received after CSI corresponding to a non-read related command will result in an aborted data output operation. Accordingly, if the memory controller issues invalid read commands by asserting the DSI control pulse, a static logic "0" or "1" data stream is returned to it. Hence the memory controller can recognize this data pattern as a result of an invalid command, and no data is provided to the host system. In the situation of FIG. 19, the memory controller can re-issue the first read command packet since the original read operation was aborted with the issuance of the non-read command packet before assertion of DSI.

The previously described system with memory devices operates at greater speeds than parallel multi-drop systems of the prior art, thereby providing superior performance. The performance of each memory device, and of the system in turn, is further improved as more serial input and output data ports are provided. If the memory devices employ the previously described configurable data width embodiments, each memory device is dynamically configurable to operate with a minimal active number of data pads to reduce power consumption. The memory devices are configurable through the issuance of a single command propagated serially to all the memory devices from the memory controller in a broadcast operation. Robust operation of the system is ensured by implementing the data output inhibit algorithm, which prevents valid data from being provided to the memory controller, when the memory controller improperly issues a read output control signal. These aforementioned embodiments can be implemented independently of each other, or in combination with each other in a memory device or memory controller of a system.

Certain adaptations and modifications of the described embodiments can be made. Therefore, the above discussed embodiments are considered to be illustrative and not restrictive.

What is claimed is:

1. A system comprising:
a memory controller having a first number of output ports, the memory controller operable to provide a command to access data width configuration data representing a data width, from one output port of the first number of output ports; and,
a memory device coupled to the memory controller in a ring topology, the memory device having an input/output register operable to store the data width configuration data, a second number of data input pads, and the second number of data output pads, the memory device operable to provide the data width configuration data from one data output pad of the second number of data output pads in response to receiving the command at one data input pad of the second number of data input pads; wherein the memory controller is further operable to receive the data width configuration provided by the memory device.

2. The system of claim 1, wherein the memory controller includes the first number of input ports and is operable to receive the data width configuration data from one input port of the first number of input ports.

3. The system of claim 1, wherein all of the second number of data input pads are disabled except for the one data input pad, and all of the second number of data output pads are disabled except for the one data output pad.

4. The system of claim 3, wherein the memory device includes a current active width register operable to store a configuration code received from the memory controller, the configuration code operable to enable a third number of the data input pads and the third number of the data output pads.

5. The system of claim 4, wherein the third number is less than or equal to the second number.

6. The system of claim 5, wherein the memory device includes a memory die encapsulated in a package, the package having a fourth number of data input pins and data output pins.

7. The system of claim 6, wherein a smallest common number of data input pins are electrically connected to the smallest common number of data input pads, the smallest common number being the smaller of the second number and the fourth number.

8. The system of claim 1, wherein the memory controller is coupled to a plurality of memory devices in a ring topology and the memory controller is operable to receive data width configuration data of each of the plurality of memory devices.

9. The system of claim 8, wherein the memory controller is operable to select a data width based on the data width configuration data received from each of the plurality of memory devices.

10. The system of claim 1, wherein the data width configuration data represents an input data width and an output data width.

11. A memory device operable to be coupled to a memory controller in a ring topology, the memory device having N data input/output circuit blocks, where N is an integer value greater than 1, and comprising:
a current active width register for storing a configuration code corresponding to a data width;
a data input/output circuit block of the N data input/output circuit blocks for receiving the configuration code from a data input pad, the data input/output circuit block passing the configuration code to the current active width register;
at least one data input/output circuit block of the N data input/output circuit blocks selectively enabled in response to the configuration code stored in the current active width register; and
an input/output register for storing maximum data width configuration data of the memory device, the memory device operable to provide the maximum data width configuration data to the memory controller via the data input/output circuit block through a data output pad of the memory device.

12. The memory device of claim 11, wherein the current active width register, the data input/output circuit block, the at least one selectable data input/output circuit block, the input/output register, the data input pad and the data output pad are formed on a memory die encapsulated in a package.

13. The memory device of claim 12, wherein the package includes exactly one data input pin coupled to the data input/output circuit block.

14. The memory device of claim 13, wherein the package includes at least one additional data input pin.

15. The memory device of claim 12, wherein the package includes a data input pin coupled to the data input/output circuit block, and at least one data input pin coupled to the at least one selectable data input/output circuit block.

16. A method for setting a data width for a system having a plurality of memory devices connected in a ring topology with a memory controller, comprising:
accessing, from the plurality of memory devices to the memory controller, configuration data stored by each memory device of the plurality of memory devices, the configuration data corresponding to data widths of the plurality of memory devices;
determining a smallest data width of all the configuration data received from the plurality of memory devices; and,
setting a selected data width between one and the smallest data width, in at least one of the plurality of memory devices.

17. The method of claim 16, wherein accessing includes assigning an identification number for at least one of the plurality of memory devices.

18. The method of claim 16, wherein accessing includes issuing a read command serially on a single data line corresponding to a data width of one.

19. The method of claim 16, wherein the selected data width is the smallest data width for maximizing performance of the system.

20. The method of claim 19, wherein the selected data width is one for minimizing power consumption of the system.

21. The method of claim 16, wherein setting includes loading a current active width register of the at least one memory device with a configuration code corresponding to the selected data width.

* * * * *